United States Patent
Moon et al.

(10) Patent No.: US 9,368,691 B2
(45) Date of Patent: Jun. 14, 2016

(54) LIGHT EMITTING DEVICE AND LIGHT EMITTING DEVICE PACKAGE INCLUDING THE SAME

(71) Applicant: LG INNOTEK CO., LTD., Seoul (KR)

(72) Inventors: Ji Hyung Moon, Seoul (KR); Sung Kyoon Kim, Seoul (KR); Min Gyu Na, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/606,499

(22) Filed: Jan. 27, 2015

(65) Prior Publication Data

US 2015/0333230 A1 Nov. 19, 2015

(30) Foreign Application Priority Data

May 15, 2014 (KR) .................. 10-2014-0058603

(51) Int. Cl.
| | |
|---|---|
| *H01L 33/12* | (2010.01) |
| *H01L 33/46* | (2010.01) |
| *H01L 27/15* | (2006.01) |
| H01L 33/40 | (2010.01) |
| H01L 33/42 | (2010.01) |
| H01L 33/10 | (2010.01) |

(52) U.S. Cl.
CPC .............. *H01L 33/46* (2013.01); *H01L 27/156* (2013.01); *H01L 33/10* (2013.01); *H01L 33/405* (2013.01); *H01L 33/42* (2013.01)

(58) Field of Classification Search
CPC ....... H01L 33/46; H01L 33/405; H01L 27/15; H01L 25/0753; H01L 33/38; H01L 33/42; H01L 33/486; H01L 33/62

USPC ......... 257/12–13, 40, 81, 84, 87–89, 98–100, 257/347–348, 433–434
See application file for complete search history.

(56) References Cited

U.S. PATENT DOCUMENTS

2013/0049030 A1* 2/2013 Jeong .................... H01L 33/08
257/88

FOREIGN PATENT DOCUMENTS

| EP | 1 973 161 A2 | 9/2008 |
|---|---|---|
| EP | 2 587 542 A1 | 5/2013 |
| KR | 2013-0079941 A | 7/2013 |

OTHER PUBLICATIONS

European Search Report for Application 15153484.9 dated Aug. 12, 2015.

* cited by examiner

*Primary Examiner* — Dung Le
(74) *Attorney, Agent, or Firm* — KED & Associates LLP

(57) ABSTRACT

Disclosed is a light emitting device including a plurality of light emitting cells disposed on a substrate, at least one connection electrode for connecting the light emitting cells, and a first insulating layer disposed between adjacent light emitting cells, wherein each of the light emitting cells includes a light emitting structure including first and second conductive type semiconductor layers and an active layer, and a reflective layer disposed on the second conductive type semiconductor layer, wherein the connection electrode connects the first conductive type semiconductor layer of a first one of the adjacent light emitting cells to the reflective layer of a second one at the adjacent light emitting cells, and wherein a first width of the second conductive type semiconductor layer is the same as or greater than a second width of the reflective layer, and the first direction differs from a thickness direction of the light emitting structure.

27 Claims, 25 Drawing Sheets

SECOND DIRECTION (Y)

FIRST DIRECTION (X)

LIGHT EMITTING DEVICE AND LIGHT EMITTING DEVICE PACKAGE INCLUDING THE SAME

CROSS-REFERENCE TO RELATED APPLICATION(S)

This application claims priority under 35 U.S.C. §119 to Korean Application No. 10-2014-0058603, filed in Korea on May 15, 2014, the subject matter of which is hereby incorporated by reference as if fully set forth herein.

BACKGROUND

1. Field

Embodiments relate to a light emitting device and a light emitting device package including the same.

2. Background

Red, green and blue light emitting diodes (LEDs) capable of realizing high luminance and white light were developed, based on development of metal organic chemical vapor deposition and molecular beam growth of gallium nitride (GaN).

Such LEDs do not contain environmentally harmful materials such as mercury (Hg) used in conventional lighting apparatuses such as incandescent lamps or fluorescent lamps and thus advantageously have superior eco-friendliness, long lifespan and low power consumption, thus being used as alternatives of conventional light sources. The key factors in competitiveness of such LEDs are to realize high luminance, based on chips with high efficiency and high power and packaging technologies.

In order to realize high luminance, an increase in light extraction efficiency is important. A variety of methods using flip-chip structures, surface texturing, patterned sapphire substrates (PSSs), photonic crystal techniques, anti-reflective layer structures and the like are being researched in order to increase light extraction efficiency.

In general, a light emitting device includes a light emitting structure disposed on a substrate, wherein the light emitting structure includes a first conductive type semiconductor layer, an active layer and a second conductive type semiconductor layer, a first electrode for supplying first power to the first conductive type semiconductor layer and a second electrode for supplying second power to the second conductive type semiconductor layer.

A great deal of research to improve electrical and optical properties of the light emitting device and the light emitting device package including the same is underway.

SUMMARY

Embodiments provide a light emitting device with improved optical and electrical properties and a light emitting device package including the same.

In one embodiment, a light emitting device includes a substrate, a plurality of light emitting cells disposed on the substrate, at least one connection electrode for connecting the light emitting cells, and a first insulating layer disposed between adjacent light emitting cells connected by the connection electrode and the connection electrode, wherein each of the light emitting cells includes a light emitting structure including a first conductive type semiconductor layer, an active layer and a second conductive type semiconductor layer, and a reflective layer disposed on the second conductive type semiconductor layer, wherein the connection electrode connects the first conductive type semiconductor layer of one of the adjacent light emitting cells to the reflective layer of the other and a first width of the second conductive type semiconductor layer in a first direction is the same as or greater than a second width of the reflective layer in the first direction, and the first direction is different from a thickness direction of the light emitting structure.

Each of the light emitting cells may further include a conductive layer being disposed between the reflective layer and the second conductive type semiconductor layer and having light-transmittance.

The first width, the second width and a third width of the conductive layer in the first direction may be identical.

At least one of the first width, the second width, or a third width of the conductive layer in the first direction may be different from one another.

The third width may be the same as or greater than the second width.

The first width may be the same as the third width.

The first width may be greater than the third width.

The reflective layer may ohmic-contact the second conductive type semiconductor layer.

The reflective layer may have a multiple layer structure.

The reflective layer may have reflectivity of 70% or more.

The reflective layer may include at least one of Ni, Pd, Ru, Mg, Zn, Hf, Ag, Al, Au, Pt, Cu, or Rh.

The reflective layer may have a thickness of 0.5 nm to 4 µm

The conductive layer may have a thickness of 0.5 nm to 4 µm

The light emitting device may further include a first electrode unit connected to the first conductive type semiconductor layer of one of the light emitting cells, and a second electrode unit connected to the reflective layer of the other of the light emitting cells.

The light emitting device may further include a second insulating layer disposed on the connection electrode and on the first insulating layer, wherein the first and second electrode units penetrate the first and second insulating layer and are connected to the first conductive type semiconductor layer and the reflective layer, respectively.

The second insulating layer may have a minimum thickness of 1 nm to 80 nm.

At least one of the first or second insulating layers may include a distributed Bragg reflector.

The connection electrode may include a reflective material.

The shortest horizontal distance in the first direction between adjacent connection electrodes may be 5 µm or more.

In another embodiment, a light emitting device package includes a submount, first and second metal layers spaced from each other on the submount, the light emitting device described above, and first and second bump units for electrically connecting the light emitting device to the first and second metal layers, respectively.

BRIEF DESCRIPTION OF THE DRAWINGS

The embodiments will be described in detail with reference to the following drawings in which like reference numerals refer to like elements wherein.

DESCRIPTION OF SPECIFIC EMBODIMENTS

Figure 1:
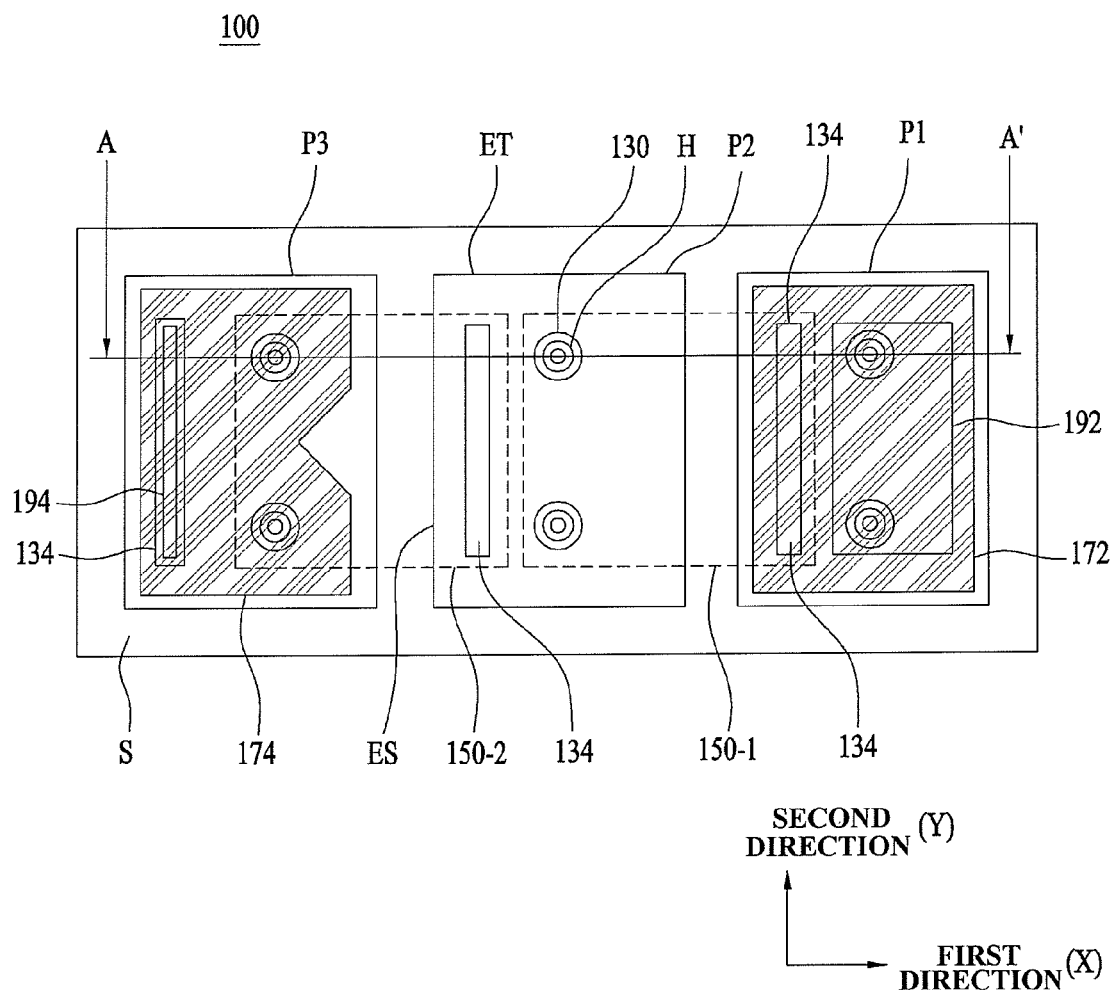
FIG. 1 is a plan view illustrating a light emitting device according to an embodiment.

Reference will now be made in detail to embodiments, examples of which are illustrated in the accompanying drawings. However, the present disclosure may be embodied in many different forms and should not be construed as limited to the embodiments set forth herein. Rather, these embodiments are provided so that this disclosure will be thorough and complete, and will fully convey the scope of the disclosure to those skilled in the art.

It will be understood that when an element is referred to as being "on" or "under" another element, it may be directly on/under the element, and one or more intervening elements may also be present. When an element is referred to as being 'on' or 'under', 'under the element' as well as 'on the element' may be included based on the element.

Relative terms such as "first", "second", "on/above/upper", and "under/below/lower" may be used herein solely to distinguish one entity or element from another entity or element without necessarily requiring or implying any physical or logical relationship or order between such entities or elements.

In the drawings, the thickness or size of each layer is exaggerated, omitted, or schematically illustrated for convenience of description and clarity. Also, the size or area of each constituent element does not entirely reflect the actual size thereof.

Hereinafter, a light emitting device, a method for manufacturing the same and a light emitting package including the same according to embodiments will be described with reference to the annexed drawings.

Figure 2:
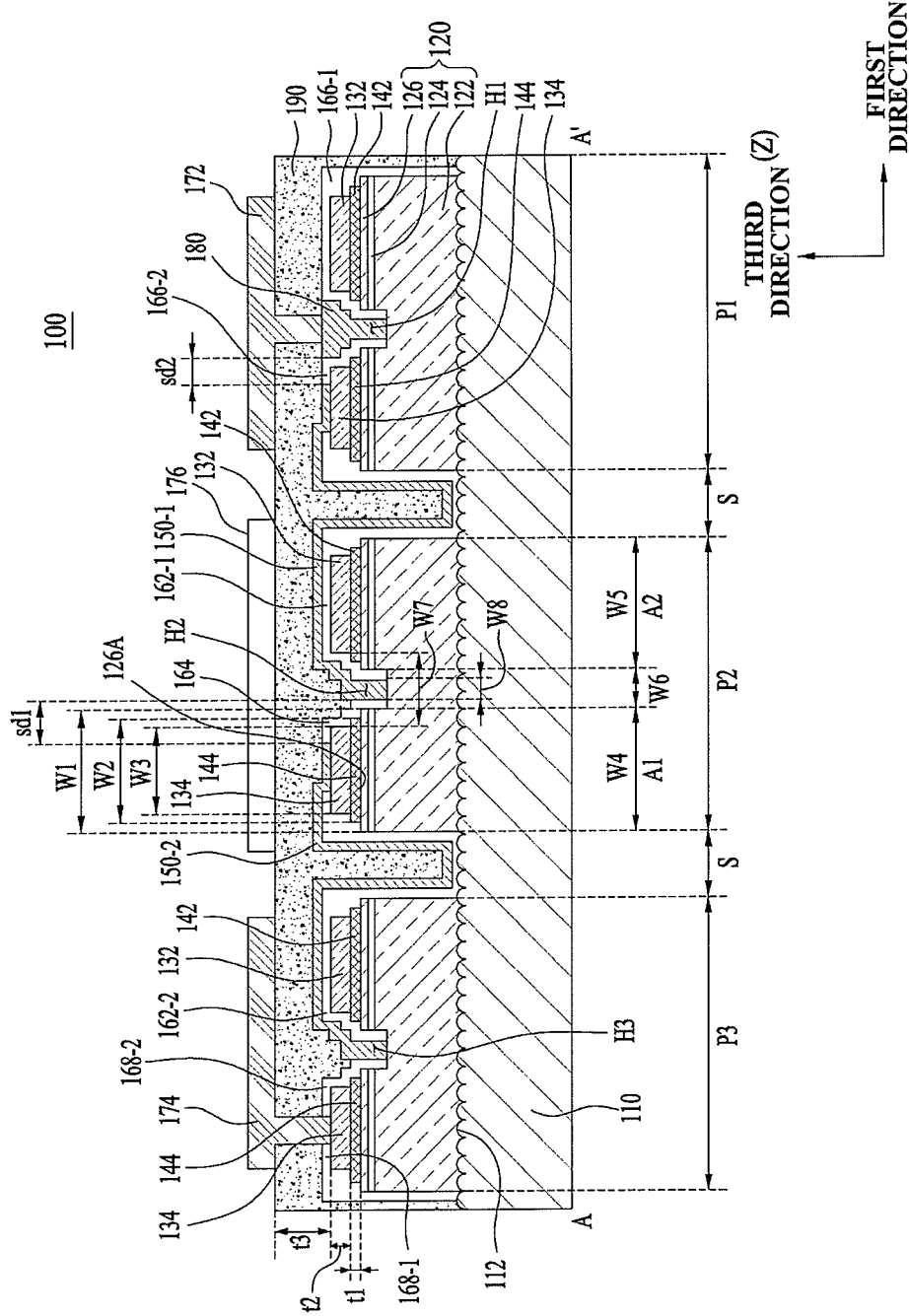
FIG. 2 is a sectional view taken along line AA' of the light emitting device shown in FIG. 1.

FIG. 1 is a plan view illustrating a light emitting device 100 according to an embodiment and FIG. 2 is a sectional view taken along line A-A' of the light emitting device 100 shown in FIG. 1.

Referring to FIGS. 1 and 2, the light emitting device 100 includes a substrate 110, N (in which N is a positive integer of 2 or more) light emitting cells (or light emitting regions, P1 to PN), M (in which 1≤M≤N−1) connection electrodes 150-1 to 150-M, a plurality of first insulating layers 162-1, 162-2, 164, 166-1, 166-2, 168-1 and 168-2, a first electrode unit 172, a second electrode unit 174, a metal electrode 180 and a second insulating layer 190.

Hereinafter, for better understanding of the embodiment, the description will be given under the assumption that N is 3, as exemplarily shown in FIGS. 1 and 2.

The light emitting cells P1, P2 and P3 are disposed on the substrate 110.

The substrate 110 may be formed of a carrier wafer, a material suitable for growth of semiconductor materials. In addition, the substrate 110 may be formed of a highly thermo-conductive material and may be a conductive substrate or an insulating substrate. For example, the substrate 110 may contain at least one of sapphire (Al2O3), GaN, SiC, ZnO, Si, GaP, InP, Ga2O3, or GaAs. The substrate 110 may be provided on upper surface thereof with an uneven (or, roughness) pattern 112. That is, the substrate 110 may be a patterned sapphire substrate (PSS) having an uneven pattern. As such, when the upper surface of the substrate 110 is provided with the uneven pattern 112, light extraction efficiency may be improved.

Although not shown in FIG. 2, a buffer layer may be interposed between the substrate 110 and the light emitting structure 120 and may be formed of a Group III-V compound semiconductor. The buffer layer functions to reduce lattice mismatch between the substrate 110 and the light emitting structure 120.

The light emitting cells P1, P2 and P3 may be electrically connected in series, as exemplarily shown in FIGS. 1 and 2, but the embodiment is not limited thereto. That is, in another embodiment, the light emitting cells P1, P2 and P3 may be electrically connected in parallel. Hereinafter, the light emitting cells P1, P2 and P3 electrically connected to one another will be referred to as first, second and third light emitting cells, respectively.

Referring to FIGS. 1 and 2, the first to third light emitting cells P1, P2 and P3 may be separated from one another by boundary regions S. Accordingly, the boundary regions S may be disposed between and around the first to third light emitting cells P1, P2 and P3. The boundary regions S may include portions of the substrate 110 exposed by mesa-etching the light emitting structure 120.

Areas of the first, second and third light emitting cells P1, P2 and P3 may be identical, but the embodiment is not limited thereto.

Each of the first, second and third light emitting cells P1, P2 and P3 may include a light emitting structure 120, reflective layers 132 and 134, and conductive layers 142 and 144.

The light emitting structure 120 may be a semiconductor layer generating light and include a first conductive type semiconductor layer 122, an active layer 124, and a second conductive type semiconductor layer 126. The first conductive type semiconductor layer 122, the active layer 124, and the second conductive type semiconductor layer 126 may be stacked in this order on the substrate 110.

The first conductive type semiconductor layer 122 may be implemented with a Group III-V or Group II-VI compound semiconductor or the like, and may be doped with a first conductive type dopant.

For example, the first conductive type semiconductor layer 122 may be a semiconductor having a compositional formula of In$_x$Al$_y$Ga1-x-yN (0≤x≤1, 0≤y≤1, 0≤x+y≤1). For example, the first conductive type semiconductor layer 122 may contain any one of InAlGaN, GaN, AlGaN, InGaN, AlN, or InN and may be doped with an n-type dopant (for example, Si, Ge, or Sn).

Figure 11:
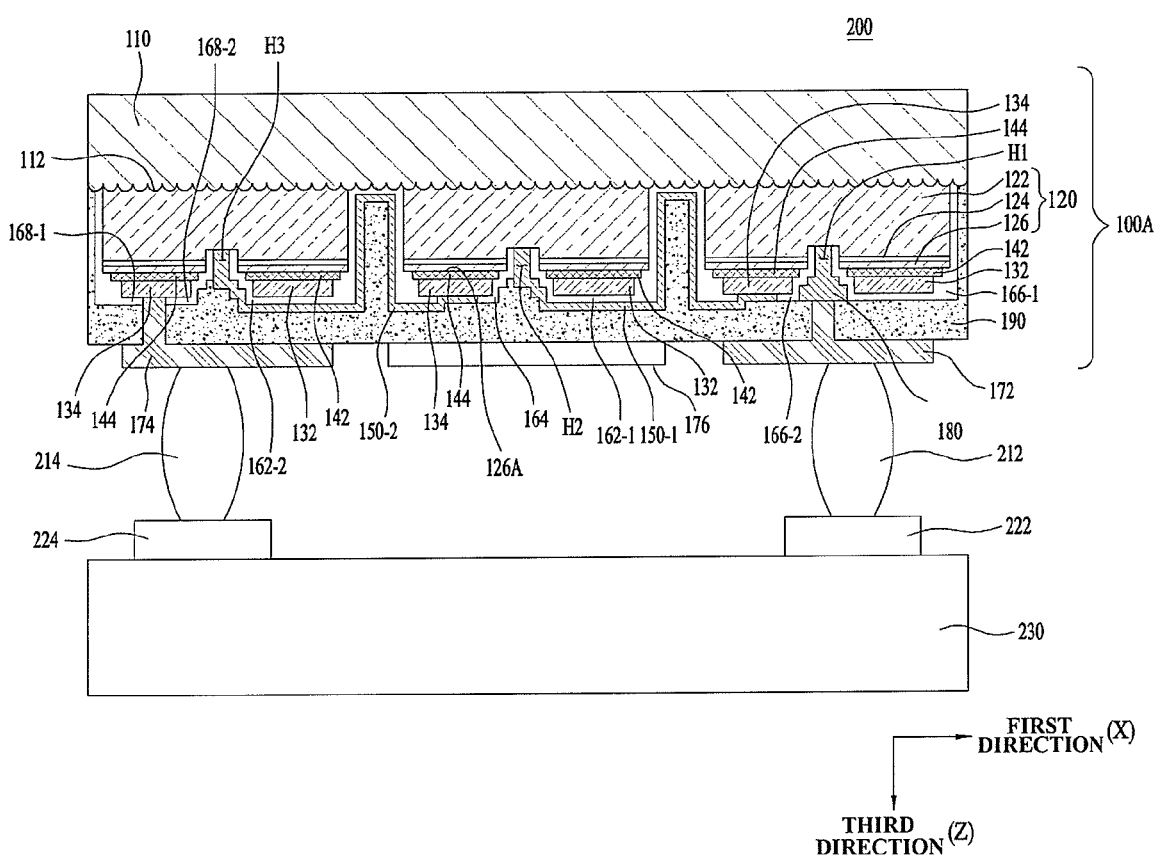
FIG. 11 is a sectional view illustrating a light emitting device package including the light emitting device according to the embodiment.

When the light emitting device 100 exemplarily shown in FIGS. 1 and 2 is applied to the light emitting device package 200 having a flip-chip bonding structure exemplarily shown in FIG. 11, the substrate 110 and the first conductive type semiconductor layer 122 may include a light-transmitting material.

The active layer 124 is interposed between the first conductive type semiconductor layer 122 and the second conductive type semiconductor layer 126, and may generate light by energy generated during recombination of electrons and holes respectively supplied from the first conductive type semiconductor layer 122 and the second conductive type semiconductor layer 126.

The active layer 124 may be formed of a semiconductor compound, for example, a Group III-V or Group II-VI compound semiconductor and may have a double junction structure, a single well structure, a multiple well structure, a quantum wire structure or a quantum dot structure.

When the active layer 124 is a single or a quantum well structure, it may include a well layer having a compositional formula of $InxAlyGa1-x-yN$ ($0 \leq x \leq 1$, $0 \leq y \leq 1$, $0 \leq x+y \leq 1$) and a barrier layer having a compositional formula of $InaAlbGa1-a-bN$ ($0 \leq a \leq 1$, $0 \leq b \leq 1$, $0 \leq a+b \leq 1$). The well layer may be made of a material having a lower energy band gap than that of the barrier layer.

The second conductive type semiconductor layer 126 may be implemented with a Group III-V or Group II-VI compound semiconductor and be doped with a second conductive dopant. For example, the second conductive type semiconductor layer 126 may be a semiconductor having a compositional formula of $InxAlyGa1-x-yN$ ($0 \leq x \leq 1$, $0 \leq y \leq 1$, $0 \leq x+y \leq 1$). For example, the second conductive type semiconductor layer 126 may contain any one of GaN, AlN, AlGaN, InGaN, InN, InAlGaN, AlInN, AlGaAs, GaP, GaAs, GaAsP, or AlGaInP, and be doped with a p-type dopant (for example, Mg, Zn, Ca, Sr, or Ba).

A conductive clad layer (not shown) may be interposed between the active layer 124 and the first conductive type semiconductor layer 122 or between the active layer 124 and the second conductive type semiconductor layer 126 and the conductive clad layer may be formed of a nitride semiconductor (for example, AlGaN).

In an embodiment, the first conductive type semiconductor layer 122 may be implemented with an n-type semiconductor layer and the second conductive type semiconductor layer 126 may be implemented with a p-type semiconductor layer. Accordingly, the light emitting structure 120 may include at least one of n-p, p-n, n-p-n, or p-n-p junction structures.

Meanwhile, the reflective layers 132 and 134 may be disposed on the second conductive type semiconductor layer 126 of the light emitting structure 120 and may have a single or multiple layer structure. For example, the reflective layers 132 and 134 may have a triple multilayer layer structure of first layer/second layer/third layer. Regarding the reflective layers 132 and 134, the first layer functions to reflect light, the second layer disposed on the first layer functions as a barrier layer and the third layer disposed on the second layer functions as a passivation-adhesion reinforcing layer. The first layer among the first to third layer is closest to the second conductive type semiconductor layer.

In addition, reflectivity of the reflective layers 132 and 134 is preferably as high as possible and is for example 70% or more. That is, the reflective layers 132 and 134 may include a material having a reflectivity of 70% or more.

In addition, the reflective layers 132 and 134 may include a material having excellent adhesion to the conductive layers 142 and 144.

When the conductive layers 142 and 144 are omitted, the reflective layers 132 and 134 may directly contact the second conductive type semiconductor layer 126. In this case, the reflective layers 132 and 134 may include a material which ohmic-contacts the second conductive type semiconductor layer 126 and a material having excellent adhesion to the second conductive type semiconductor layer 126.

For example, the reflective layers 132 and 134 may include a reflective metal having a high electrical conductivity, for example, at least one of Ni, Pd, Ru, Mg, Zn, Hf, Ag, Al, Au, Pt, Cu, or Rh, or an alloy thereof.

In addition, as a second thickness t2 of the reflective layers 132 and 134 increases, operation at a high current is improved. In addition, when the second thickness t2 of the reflective layers 132 and 134 is less than 0.5 nm, reflectivity of the reflective layers 132 and 134 may be deteriorated. For example, the reflective layers 132 and 134 may have a second thickness t2 of 0.5 nm to 4 µm for example, 50 nm or more.

Meanwhile, the conductive layers 142 and 144 are disposed between the reflective layers 132 and 134 and the second conductive type semiconductor layer 126 and have light transmittance. The conductive layers 142 and 144 reduce total reflection and exhibit superior transmittance.

The conductive layers 142 and 144 may be implemented as a single or multiple layer structure using one or more of transparent oxide materials having high transmittance at light emission wavelengths, such as indium tin oxide (ITO), tin oxide (TO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), aluminum tin oxide (ATO), gallium zinc oxide (GZO), IrOx, RuOx, RuOx/ITO, Ni, Ag, Ni/IrOx/Au, or Ni/IrOx/Au/ITO.

According to an embodiment, because the reflective layers 132 and 134 are disposed on the conductive layers 142 and 144, the first thickness t1 of the conductive layers 142 and 144 may be decreased. That is, as the second thickness t2 of the reflective layers 132 and 134 increases, the first thickness t1 of the conductive layers 142 and 144 decreases. As the first thickness t1 of the conductive layers 142 and 144 increases, absorbance of light by the conductive layers 142 and 144 increases, and as the first thickness t1 of the conductive layers 142 and 144 decreases, absorbance of light by the conductive layers 142 and 144 decreases. Accordingly, according to the embodiment, the reflective layers 132 and 134 are disposed on the conductive layers 142 and 144, thereby decreasing the first thickness t1 of the conductive layers 142 and 144 and thus improving optical properties of the light emitting device 100.

In addition, there may be no relationship between the first thickness t1 of the conductive layers 142 and 144 and the second thickness t2 of the reflective layers 132 and 134.

When the first thickness t1 of the conductive layers 142 and 144 is greater than 1 nm, absorbance of light by the conductive layers 142 and 144 may be increased. The first thickness t1 is 0.5 nm to 4 µm preferably 0.5 nm to 80 nm for example, 1 nm, but the embodiment is not limited thereto.

In addition, when the reflective layers 132 and 134 include a material which may ohmic-contact the second conductive type semiconductor layer 126, the conductive layers 142 and 144 may be omitted from the light emitting cells P1, P2 and P3. However, although the reflective layers 132 and 134 include the material ohmic-contacting the second conductive type semiconductor layer 126, in the case in which the light emitting device 100 includes the conductive layers 142 and 144, reliability of the light emitting device 100 is improved. The reason for this is that the conductive layers 142 and 144 serve as carrier barrier layers by blocking permeation of carries from the reflective layers 132 and 134 toward the second conductive type semiconductor layer 126.

In addition, in some cases, both the reflective layers 132 and 134 and the conductive layers 142 and 144 may be omitted from the light emitting cells P1, P2 and P3.

In addition, a first width W1 in a first direction X of an upper surface 126a of the second conductive type semiconductor layer 126 on which the reflective layers 132 and 134 are disposed, a second width W2 in the first direction X of the conductive layers 142 and 144, and a third width W3 in the first direction X of the reflective layers 132 and 134 may be equal as shown in the following Equation 1:

$$W1=W2=W3 \quad \text{[Equation 1]}$$

Referring to FIG. 1, the first direction X may be different from the second direction Y and the first and second directions X and Y may be perpendicular to each other. In addition, referring to FIG. 2, the first direction X is different from a third direction Z which is a thickness direction of the light emitting structure 120 and the first and third directions X and Z may be perpendicular to each other. The first and second directions X and Y are different from the third direction Z and may be perpendicular to the third direction Z. That is, based on the cartesian coordinates system, the first, second and third directions may correspond to X, Y and Z axes, respectively.

In addition, at least one of first, second, or third widths W1, W2, or W3 may be different from each other.

The first width W1 may be equal to or greater than the third width W3, as shown in the following Equation 2, when the light emitting device 100 does not include the conductive layers 142 and 144.

$$W1 \geq W3 \quad \text{[Equation 2]}$$

In addition, the second width W2 may be equal to or greater than the third width W3, as shown in the following Equation 3, when the light emitting device 100 includes the conductive layers 142 and 144.

$$W2 \geq W3 \quad \text{[Equation 3]}$$

In addition, the first width W1 may be equal to or greater than the second width W2 and the second width W2 is equal to or greater than the third width W3, as shown in the following Equation 4:

$$W1 \geq W2 \geq W3 \quad \text{[Equation 4]}$$

In addition, the first width W may be greater than the second width W2 and the second width W2 may be equal to or greater than the third width W3, as shown in the following Equation 5:

$$W1 > W2 \geq W3 \quad \text{[Equation 5]}$$

The process margin and reliability associated with the manufacturing of the light emitting device 100, when the first to third widths W1, W2 and W3 have the relation shown in Equation 5, are more advantageous, as compared to when the first to third widths W1, W2 and W3 have the relation shown in Equation 1.

According to process equipment, a first difference value obtained by subtracting W2 from W1 or a second difference value obtained by subtracting W3 from W2 may be changed. The first and second difference values may be greater than 0 and equal to or less than 40 µm preferably 10 µm to 30 µm for example, 1 µm to 2 µm In addition, there may be no relationship between the first to third widths W1 to W3 and the second thickness t2 of the reflective layers 132 and 134.

Meanwhile, M connection electrodes 150-1 to 150-M function to electrically connect the light emitting cells P1 to PN. Each (150-m, $1 \leq m \leq M$) of the connection electrodes 150-1 to 150-M electrically connects the reflective layer 134 of the mth light emitting cell Pm to the first conductive type semiconductor layer 122 of the m+1th light emitting cell Pm+1.

Because the description has been given under the assumption of N=3, the following description will be given under the assumption of M=2 and two connection electrodes 150-1 and 150-2 are referred to as first and second connection electrodes according to order in which the connection electrodes connect the light emitting cells P1, P2 and P3.

Specifically, the first connection electrode 150-1 electrically connects the reflective layer 134 of the first light emitting cell P1 which is one of adjacent first and second light emitting cells P1 and P2 to the first conductive type semiconductor layer 122 of the second light emitting cell P2 which is the other of the first and second light emitting cells P1 and P2.

The second connection electrode 150-2 electrically connects the reflective layer 134 of the second light emitting cell P2 which is one of adjacent second and third light emitting cells P2 and P3 to the first conductive type semiconductor layer 122 of the third light emitting cell P3 which is the other of the second and third light emitting cells P2 and P3.

Each of the first and second connection electrodes 150-1 and 150-2 is connected to the second conductive type semiconductor layer 126 via the reflective layer 134 and the conductive layer 144. Consequently, each of the first and second connection electrodes 150-1 and 150-2 functions to electrically connect the first conductive type semiconductor layer 122 of one of adjacent two light emitting cells to the second conductive type semiconductor layer 126 of the other thereof.

When the reflective layers 132 and 134 and the conductive layers 142 and 144 are omitted in each of the light emitting cells P1, P2 and P3, each of the first and second connection electrodes 150-1 and 150-2 may directly electrically connect the first conductive type semiconductor layer 122 of one of the adjacent light emitting cells to the second conductive type semiconductor layer 126 of the other thereof.

In the embodiment exemplarily shown in FIGS. 1 and 2, the first and second connection electrodes 150-1 and 150-2 electrically connect the light emitting cells P1, P2 and P3 in series from, as a starting point, a first light emitting cell P1 in which the first electrode unit 172 is disposed to, as an end point, the third light emitting cell P3 in which the second electrode unit 174 is disposed.

In addition, the first and second connection electrodes 150-1 and 150-2 may include a material ohmic-contacting the first conductive type semiconductor layer 122. For example, the material ohmic-contacting the first conductive type semiconductor layer 122 includes at least one of AuBe or AuZn, but the embodiment is not limited to the material contained in the first and second connection electrodes 150-1 and 150-2.

When the first and second connection electrodes 150-1 and 150-2 do not include the material ohmic-contacting the first conductive type semiconductor layer 122, a separate ohmic layer (not shown) may be disposed between each of the first and second connection electrodes 150-1 and 150-2 and the first conductive type semiconductor layer 122.

In addition, the first and second connection electrodes 150-1 and 150-2 may include a reflective material. In particular, when first insulating layers (that is, first insulating segments 162-1 and 162-2) described later include a material having low reflectivity, first and second connection electrodes 150-1 and 150-2 are formed using a material having higher reflectivity than that of the first insulating layers 162-1 and 162-2, so that a greater amount of light may be reflected toward the substrate 110 in the negative (−) third direction Z, when the light emitting device 100 is applied to the light emitting device package 200 exemplarily shown in FIG. 11.

In addition, the shortest first horizontal distance sd1 between the adjacent first and second connection electrodes 150-1 and 150-2 may be 5 μm or more. Here, the first horizontal distance sd1 means a minimum distance at which the adjacent first and second connection electrodes 150-1 and 150-2 are spaced from each other in the first direction X.

Meanwhile, according to an embodiment, one or more electrode holes (or, contact holes) to expose a part of the first conductive type semiconductor layer 122 may be disposed in the center of the width in the first direction X of each of the light emitting cells P1, P2 and P3. Hereinafter, the electrode holes disposed in the light emitting cells P1, P2 and P3 are referred to as first, second and third electrode holes H1, H2 and H3, respectively. That is, referring to FIG. 2, the first electrode hole H1 is disposed in the first light emitting cell P1, the second electrode hole H2 is disposed in the second light emitting cell P2, and the third electrode hole H3 is disposed in the third light emitting cell P3. In FIG. 1, 'H' means each of first, second and third electrode holes H1, H2 and H3.

The first, second and third electrode holes H1, H2 and H3 may be formed by mesa-etching the second conductive type semiconductor layer 126, the active layer 124 and the first conductive type semiconductor layer 122 to expose parts of the first conductive type semiconductor layer 122, in respective the light emitting cells P1, P2 and P3.

In addition, each of the first, second and third electrode holes H1, H2 and H3 may be formed as a blind hole extending in the third direction Z.

Hereinafter, the first, second and third electrode holes H1, H2 and H3 exemplarily shown in FIG. 2 will be described in more detail with reference to the annexed drawings. Only the second electrode hole H2 included in the second light emitting cell P2 among the first, second and third light emitting cells P1, P2 and P3 will be described with reference to FIGS. 3A to 6, but the following description may be equally applied to first and third electrode holes H1 and H3 respectively included in the first and third light emitting cells P1 and P3.

Figure 3A:
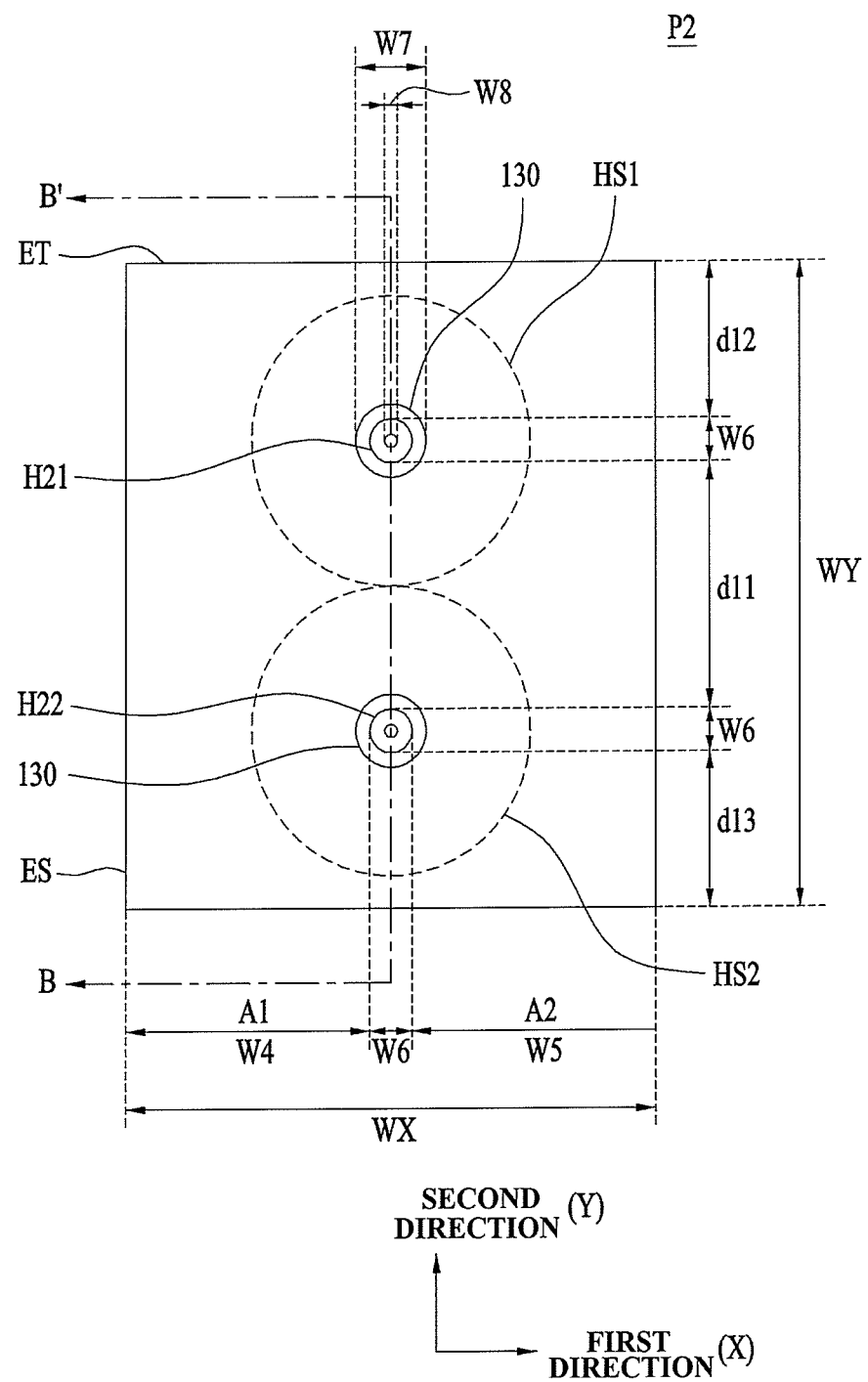
FIG. 3A is a plan view illustrating a second light emitting cell shown in FIG. 1.
Figure 3B:
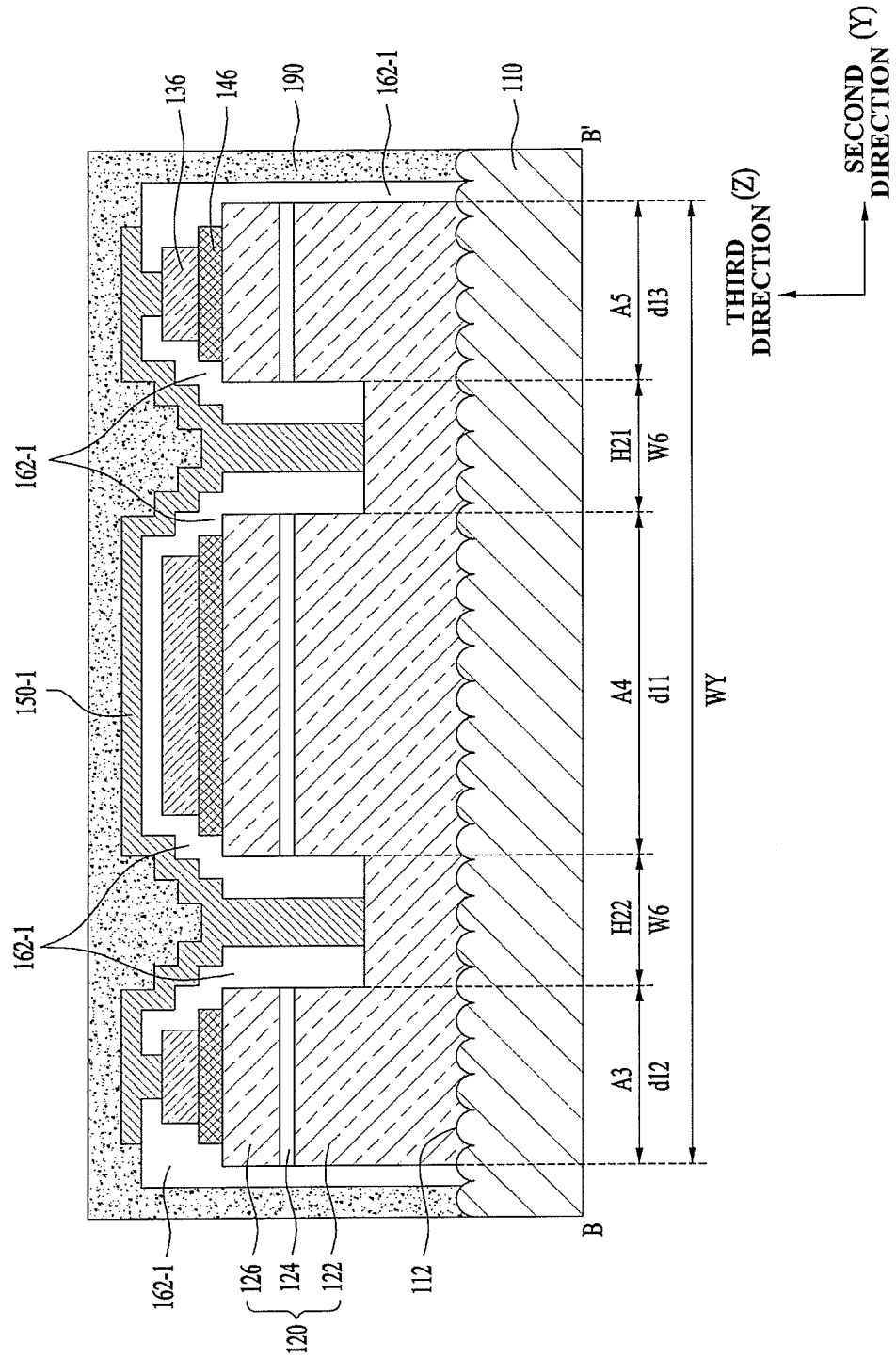
FIG. 3B is a sectional view taken along line BB' of the second light emitting cell shown in FIG. 3A.

FIG. 3A is a plan view illustrating the second light emitting cell P2 shown in FIG. 1 and FIG. 3B is a sectional view taken along line B-B' of the second light emitting cell P2 shown in FIG. 3A.

The reflective layer 134 shown in FIG. 1 is omitted in FIG. 3A, and the first insulating layer 162-1, the second insulating layer 190 and the first connection electrode 150-1 shown in FIG. 3B are not shown in FIG. 3A for convenience of description in order to intensively describe position and size of the second electrode hole H2 on the planar shape of the second light emitting cell P2.

In addition, in FIG. 3B, the reference numeral '136' corresponds to the reflective layers 132 and 134 shown in FIG. 2 and the reference numeral '146' corresponds to the conductive layers 142 and 144 shown in FIG. 2. An inside of the reference numeral '130' shown in FIGS. 1 and 3A corresponds to the gap between the reflective layers 132 and 134 and has a seventh width W7 described later.

According to an embodiment, at least one of the number or size of the second electrode holes H2 in the second light emitting cell P2, the distance between the second electrode holes H2 or arrangement direction of the second electrode holes H2, when the second electrode holes H2 are present in plural, may be determined according to at least one of the planar shape or planar size of the second light emitting cell P2 or the desired current density. This will be described in detail below.

The number of electrode hole included in the second light emitting cell P2 may be one or more. For example, as exemplarily shown in FIGS. 1, 2, 3A and 3B, the second light emitting cell P2 may include a plurality of (for example, two) 2-1st and 2-2nd electrode holes H21 and H22.

A width of the second light emitting cell P2 in the first direction X is referred to as a "horizontal width" and is represented by "WX" and a width of the second light emitting cell P2 in the second direction Y is referred to as a "vertical width" and is represented by "WY". Each of the 2-1st and 2-2nd electrode holes H21 and H22 included in the second light emitting cell P2 may be disposed in the center of the horizontal width WX of the second light emitting cell P2. However, according to another embodiment, each of the 2-1st and 2-2nd electrode holes H21 and H22 may be disposed in the center of the vertical width WY of the second light emitting cell P2.

Referring to FIGS. 3A and 3B, the horizontal width WX and the vertical width WY of the second light emitting cell P2 are represented by the following Equation 6 and 7, respectively:

$$WX = W4 + W6 + W5 \qquad \text{[Equation 6]}$$

$$WY = d12 + 2 \times W6 + d11 + d13 \qquad \text{[Equation 7]}$$

Referring to FIG. 3A, the 2-1st and 2-2nd electrode holes H21 and H22 disposed in the center of the horizontal width WX of the second light emitting cell P2 are spaced from each other by a constant distance in the second direction Y, but the embodiment is not limited thereto. According to another embodiment, the 2-1st and 2-2nd electrode holes H21 and H22 may be spaced from each other by a constant distance in at least one direction of the first or second directions X and Y.

As shown in FIG. 3A, when the 2-1st and 2-2nd electrode holes H21 and H22 are disposed in the center of the horizontal width WX, the plane of the second light emitting cell P2 may be divided into first and second regions A1 and A2 in the first direction X, based on the center of the 2-1st and 2-2nd electrode holes H21 and H22. In addition, as exemplarily shown in FIG. 3B, when the 2-1st and 2-2nd electrode holes H21 and H22 are spaced from each other in the second direction Y, the cross-section of the light emitting cell P2 may be divided into third, fourth and fifth regions A3, A4 and A5 in the second direction Y, based on the center of the 2-1st and 2-2nd electrode holes H21 and H22.

Since the 2-1st and 2-2nd electrode holes H21 and H22 are disposed in the center of the horizontal width WX in the second light emitting cell P2, the fourth width W4 in the first direction X of the first region A1 disposed at a left side of the 2-1st and 2-2nd electrode holes H21 and H22 may be equal to the fifth width W5 in the first direction X of the second region A2 disposed at a right side of the 2-1st and 2-2nd electrode holes H21 and H22.

As described above, the reason for disposing the 2-1st and 2-2nd electrode holes H21 and H22 in the center of the horizontal width WX of the second light emitting cell P2 is that carriers (for example, electrons) supplied from the first connection electrode 150-1 through the second electrode hole H2 to the first conductive type semiconductor layer 122 are uniformly spread to the light emitting structure 120 of the first region A1 and the light emitting structure 120 of the second region A2, as shown in FIG. 2. Although not shown, according to another embodiment, for the same reason, the 2-1st and 2-2nd electrode holes H21 and H22 may be disposed in the center of the vertical width WY of the second light emitting cell P2.

Hereinafter, a minimum distance between the second electrode holes which are the closest to each other in the second light emitting cell P2 is referred to as a "first distance". For example, a minimum distance d11 between 2-1st and 2-2nd electrode holes H21 and H22 which are the closest to each other in the second light emitting cell P2 may correspond to the distance d11. As shown in FIG. 3A, the first distance d11 is present as the shortest distance between the boundary of the 2-1st electrode hole H21 and the boundary of the 2-2nd electrode hole H22. However, unlike what is shown in FIG. 3A, the first distance d11 may correspond to a distance between the center of the 2-1st electrode hole H21 and the center of the 2-2nd electrode hole H22.

In addition, the minimum distance between an edge ET or ES of the second light emitting cell P2 and one of the 2-1st and 2-2nd electrode holes H21 and H22 is defined as a "second distance".

As exemplarily shown in FIGS. 3A and 3B, the second light emitting cell P2 having a rectangular planar shape has two edges ES facing each other in the first direction X and two edges ET facing each other in the second direction Y.

For example, the minimum distance d12 and d13 between each of edges ES and ET of the second light emitting cell P2 and each of the 2-1st and 2-2nd electrode holes H21 and H22 may correspond to the second distance. As shown in FIGS. 3A and 3B, the second distance d12 corresponds to the minimum distance between the edge ET and the boundary of the 2-1st electrode hole H21. However, unlike what is shown in FIGS. 3A and 3B, the second distance d12 may correspond to the minimum distance between the edge ET and the center of the 2-1st electrode hole H21. Similarly, the second distance d13 is shown as the minimum distance between the edge ET and the boundary of the 2-2nd electrode hole H22, but may correspond to the minimum distance between the edge ET and the center of the 2-2nd electrode hole H22.

In addition, according to size, shape and the like of the second light emitting cell P2, the fourth width W4 or the fifth width W5 which is the minimum distance in the first direction X between the edge ES and the 2-1st or 2-2nd electrode hole H21 or H22 may correspond to the second distance.

The fourth width W4 or the fifth width W5 may be different from the second distances d12 and d13.

In addition, the second distances d12 and d13 may be identical or different.

In addition, each of the second distances d12 and d13 may be greater than half of the first distance d11 and the half of the first distance d11 may correspond to each of the second distances d12 and d13.

When the half of the first distance d11 corresponds to each of the second distances d12 and d13, carriers (for example, electrons) may be uniformly spread into the third region A3, the fourth region A4 and the fifth region A5. That is, referring to FIG. 3B, the carriers are supplied to the left side of the fourth region A4 in the same amount as carriers supplied from the first connection electrode 150-1 connected to the first conductive type semiconductor layer 122 through the 2-2nd electrode hole H22 toward the third region A3. In addition, the carriers are supplied to the right side of the fourth region A4 in the same amount as carriers supplied from the first connection electrode 150-1 connected to the first conductive type semiconductor layer 122 through the 2-1st electrode hole H21 toward the fifth region A5. Accordingly, when the half of the first distance d11 corresponds to the second distances d12 and d13, the carriers may be uniformly spread.

Consequently, when the 2-1st and 2-2nd electrode holes H21 and H22 are disposed in the center of the horizontal width WX in the second direction Y, current diffusion areas HS1 and HS2 disposed based on the 2-1st and 2-2nd electrode holes H21 and H22 may be uniform, as shown in FIG. 3A.

In addition, according to the planar shape and size of the second light emitting cell P2 or desired current density, the second electrode hole H2 may be two or more in number and may be disposed in various forms. This will be described in detail below.

FIGS. 4A to 4H are plan views illustrating the second light emitting cell P2 according to another embodiment. In the respective drawings, for convenience of description, only the second electrode hole is represented by a solid line and the gap 130 having a seventh width W7 between the reflective layers 132 and 134 and connection electrodes having an eighth width W8 are omitted. In addition, parts represented by dotted lines in FIGS. 4A to 4H mean current diffusion areas.

Figure 4A:
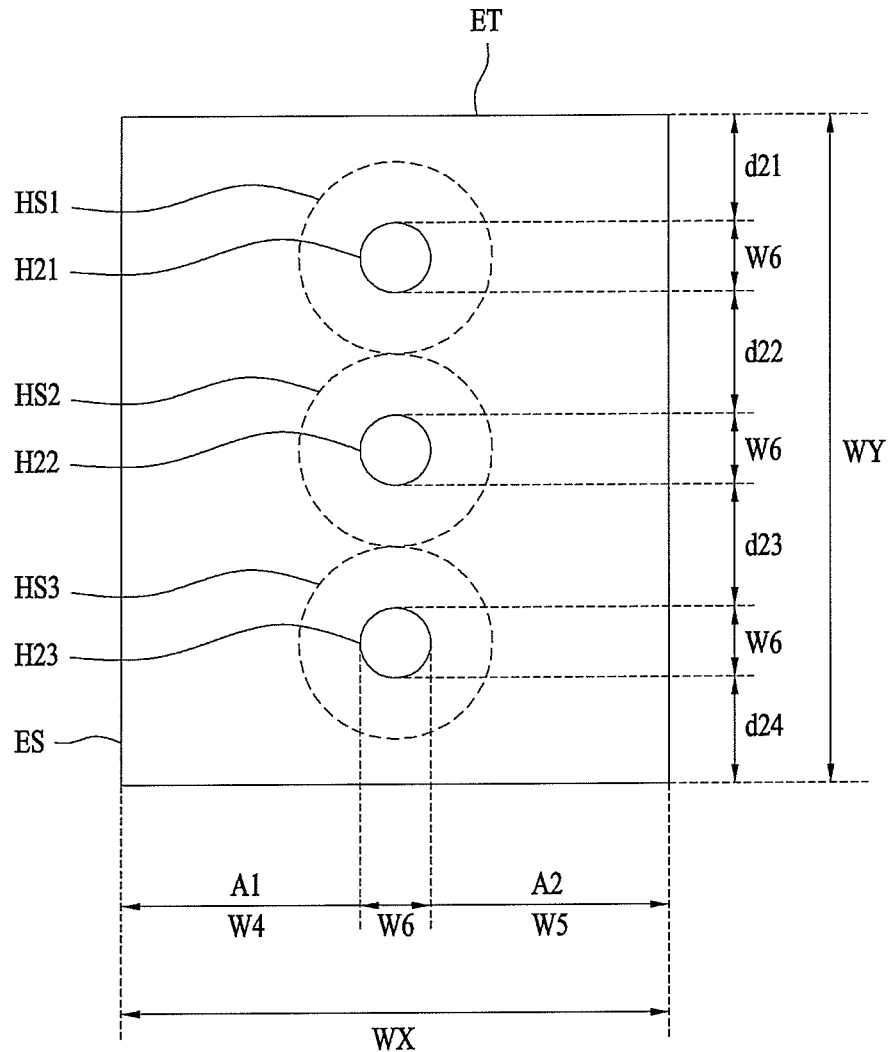
FIGS. 4A to 4H are plan views illustrating a second light emitting cell according to another embodiment.

As the number of second electrode holes in the same plane area of the second light emitting cell P2 increases, the plane size of the second electrode hole decreases. Referring to FIG. 4A, the second light emitting cell P2 may include three 2-1st, 2-2nd and 2-3rd electrode holes H21, H22 and H23. When the second light emitting cell P2 shown in FIG. 3A and the second light emitting cell P2 shown in FIG. 4A have the same planar size (horizontal width×vertical width), the size of the second electrode holes H21, H22 and H23 shown in FIG. 4A may be smaller than that of the second electrode holes H21 and H22 shown in FIG. 3A.

In addition, like the second light emitting cell P2 shown in FIG. 3A, 2-1st, 2-2nd and 2-3rd electrode holes H21, H22 and H23 in the second light emitting cell P2 exemplarily shown in FIG. 4A may be disposed in the center of the horizontal width WX. Accordingly, the fourth width W4 may be equal to the fifth width W5.

In addition, the first distance of the 2-1st, 2-2nd and 2-3rd electrode holes H21, H22 and H23 may be uniform. That is, the first distance d22 between the 2-1st and 2-2nd electrode holes H21 and H22 may be equal to the first distance d23 between the 2-2nd and 2-3rd electrode holes H22 and H23. However, according to another embodiment, d22 may be substantially equal to d23.

In addition, half of the first distance d22 may correspond to the second distance d21 and half of the first distance d23 may correspond to the second distance d24. In addition, the second distances d21 and d24 may be uniform or non-uniform. In addition, the second distances d21 and 24 may be different from the fourth width W4 or the fifth width W5.

As exemplarily shown in FIG. 4A, when the 2-1st, 2-2nd and 2-3rd electrode holes H21, H22 and H23 are disposed in the center of the horizontal width WX and half of the first distances d22 and d23 correspond to the second distances d21 and d24, carriers (for example, electrons) may be uniformly spread and supplied to the light emitting structure 120. Accordingly, current diffusion areas HS1, HS2 and HS3 disposed based on 2-1st, 2-2nd and 2-3rd electrode holes H21, H22 and H23 may be uniform.

According to another embodiment, as exemplarily shown in FIGS. 4B to 4D and FIGS. 4F to 4H, the second light emitting cell P2 may include second electrode holes disposed in the first direction as well as in the second direction.

In the second light emitting cell P2 exemplarily shown in FIGS. 4B to 4D and FIGS. 4F to 4H, the first distances which are the minimum distances between the second electrode holes in the first and second directions X and Y are uniform.

In addition, in the second light emitting cell P2 exemplarily shown in FIGS. 4B to 4D and FIGS. 4F to 4H, the second distance, which is the minimum distance between the edge ES or ST, and the second electrode hole, may be half of the first distance.

In addition, the planar shape of the second light emitting cell P2 exemplarily shown in FIGS. 1 and 3A, and FIGS. 4A to 4D is a rectangle, while the planar shape of the second light emitting cell P2 exemplarily shown in FIGS. 4E to 4H is a square. Accordingly, the second electrode holes in the second light emitting cell P2 exemplarily shown in FIGS. 1 and 3A, and FIGS. 4A to 4D may be disposed in the center of the horizontal width, while the second electrode holes in the second light emitting cell P2 exemplarily shown in FIGS. 4E to 4H may be disposed in the center of the horizontal width and the vertical width.

The relationship between the first distance, the second distance, the third distance, the fourth width, the fifth width and the sixth width in the second light emitting cell P2 exemplarily shown in FIGS. 4B to 4H will be exemplarily described as follows, but the embodiment is not limited thereto. However, the first to third distances and the fourth to sixth width may be varied as long as current spreading is uniform and dense. Here, the "third distances" mean distances, other than the second distances, between the edges ET and ES, and the second electrode holes in the second light emitting cell P2.

Figure 4B:
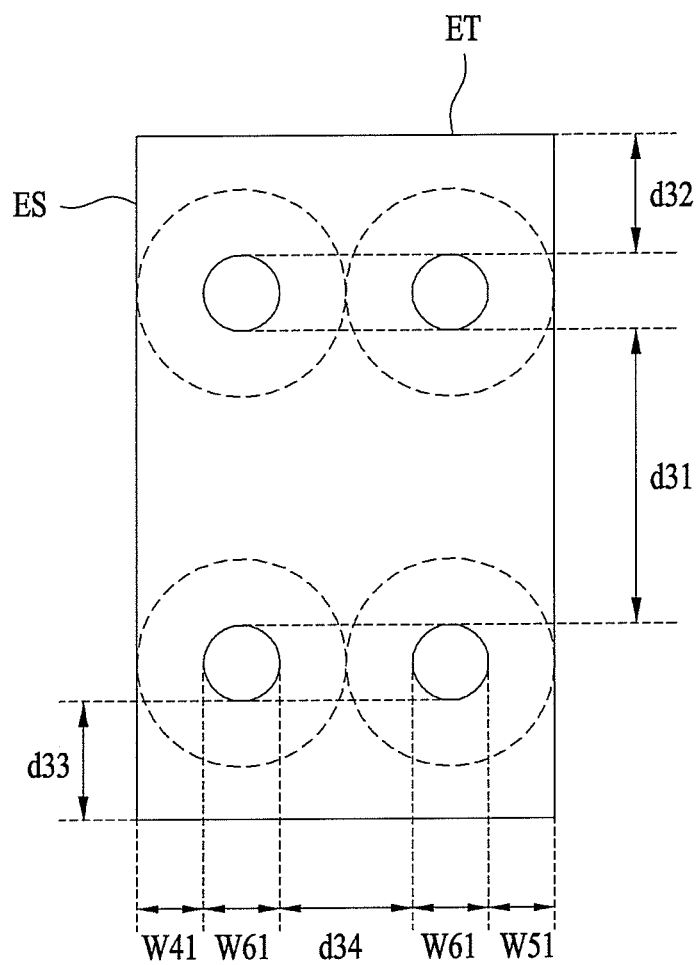

First, relation of the first distances d31 and d34, the second distances (fourth width W41 and the fifth width W51) and third distances d32 and d33 in the second light emitting cell P2 exemplarily shown in FIG. 4B may be represented by the following Equation 8, but the embodiment is not limited thereto.

$$d34=2\lambda W41$$

$$W41=W51$$

$$d32=d33$$

$$d33 \ne W41 \qquad \text{[Equation 8]}$$

Figure 4C:
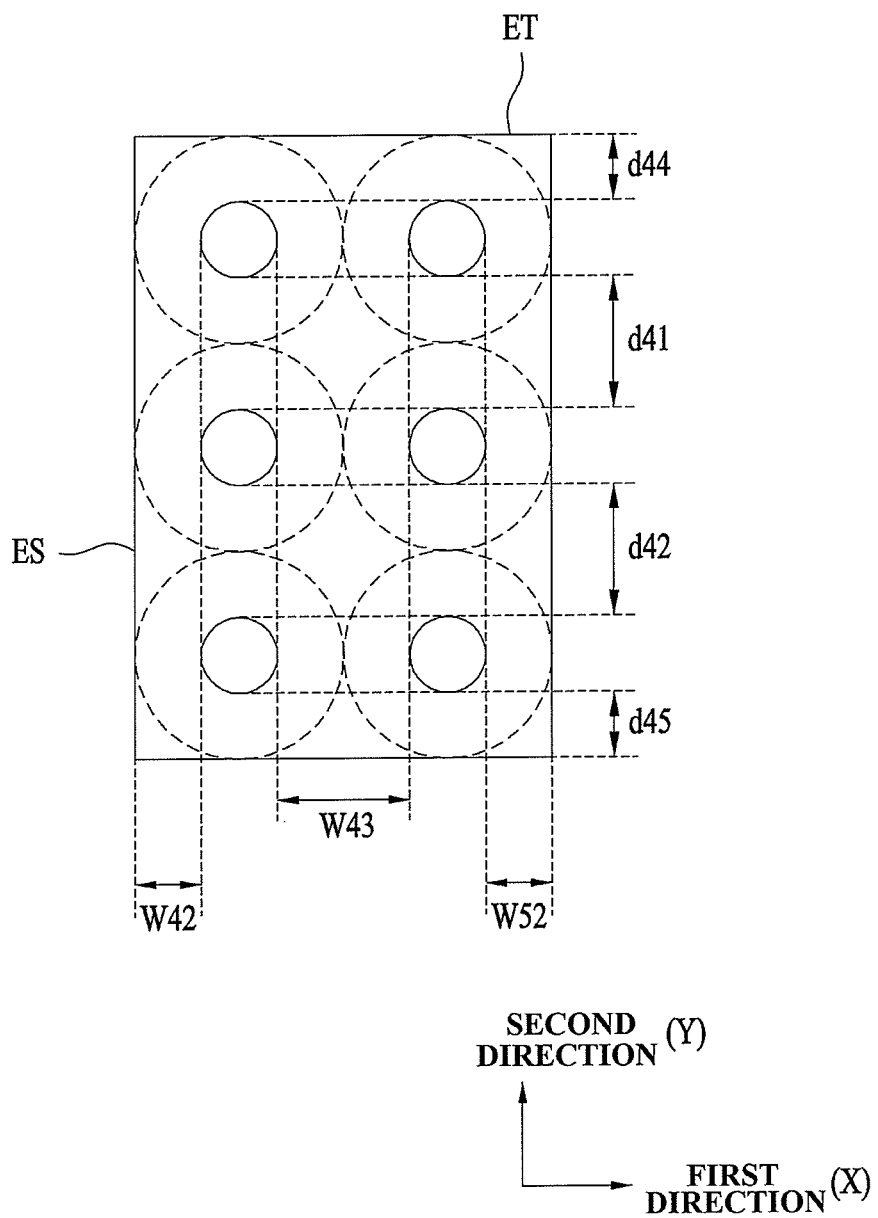

In addition, relation of first distances d41, d42 and d43 and second distances (fourth width W42, fifth widths W52, d44 and d45) in the second light emitting cell P2 exemplarily shown in FIG. 4C may be represented by the following Equation 9, but the embodiment is not limited thereto.

$$d41=d42=d43$$

$$d41=2 \times d44$$

$$d44=d45=W42=W52 \qquad \text{[Equation 9]}$$

Figure 4D:
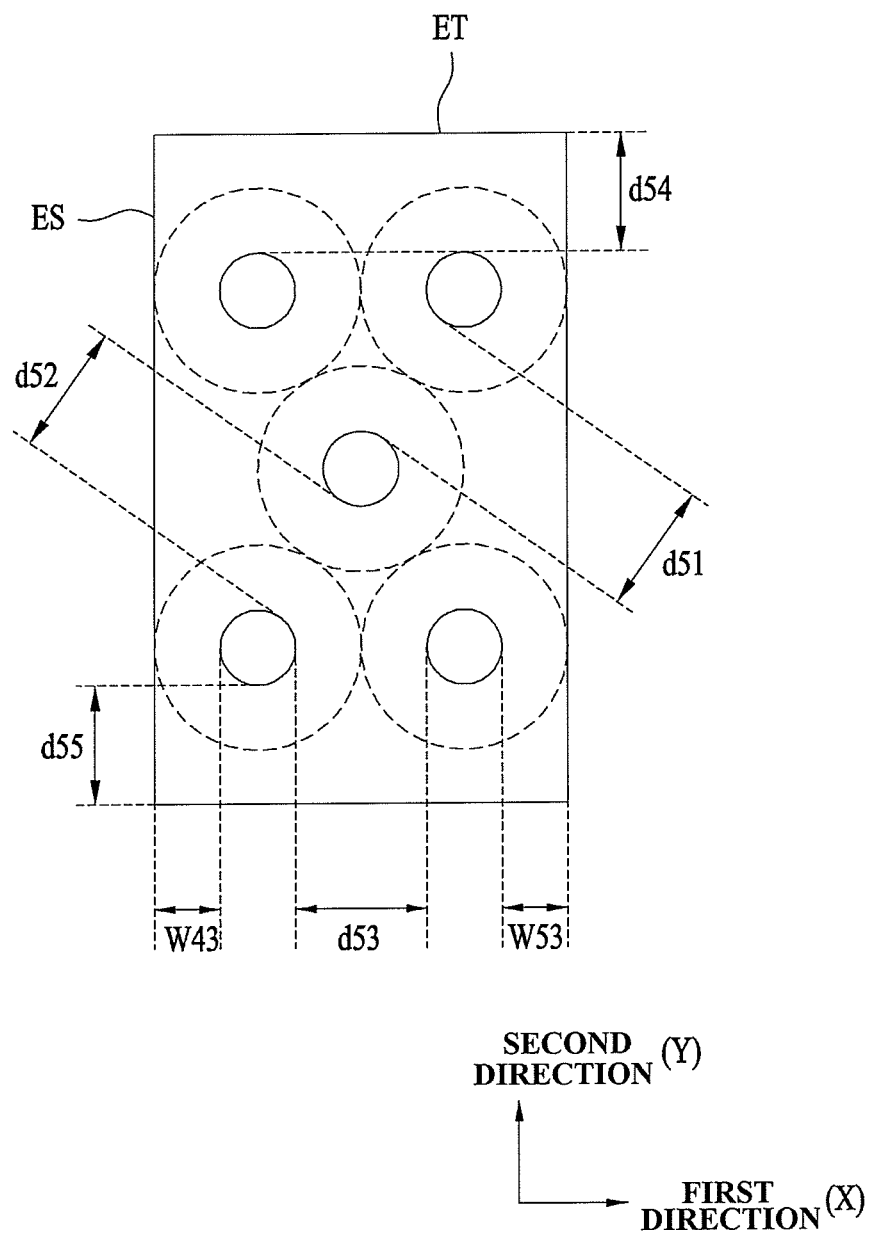

In addition, relation of the first distances d51, d52 and d53, second distances (fourth width W43 and fifth width W53), and third distances d54 and d55 in the second light emitting cell P2 exemplarily shown in FIG. 4D may be represented by the following Equation 10, but the embodiment is not limited thereto.

$$d51=d52=d53$$

$$d53=2 \times W43$$

$$W43=W53$$

$$d54=d55$$

$$d54 \ne W43 \qquad \text{[Equation 10]}$$

In the case in which planar areas of the second light emitting cells P2 exemplarily shown in FIGS. 4B to 4D are identical, current spreading is denser and more uniform when the second electrode holes are disposed as exemplarily shown in FIG. 4C, as compared to when the second electrode holes are disposed as exemplarily shown in FIG. 4B or 4D.

When the planar area of the second light emitting cells P2 exemplarily shown in FIGS. 4B to 4D is equal to the planar area of the second light emitting cells P2 exemplarily shown in FIG. 4A, sixth widths respectively exemplarily shown in FIGS. 4B to 4D, for example, the sixth width W61 shown in FIG. 4B is less than the sixth width W6 exemplarily shown in FIG. 4A.

Figure 4E:
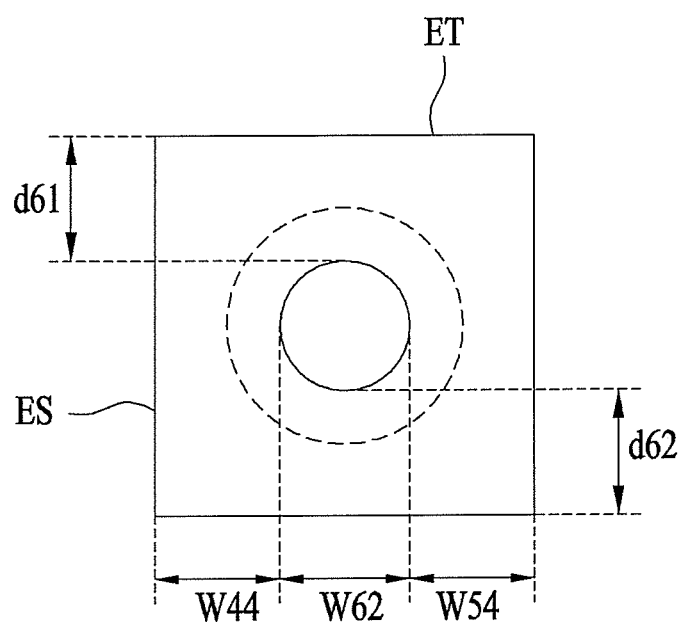
Figure 4E:
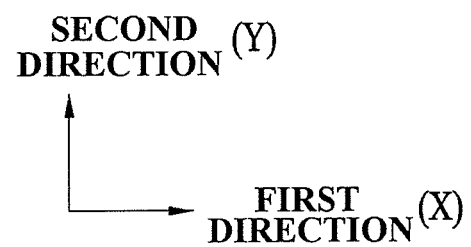

In addition, relation of the second distances (fourth width W44, fifth width W54, d61 and d62) in the second light emitting cell P2 exemplarily shown in FIG. 4E may be represented by the following Equation 11, but the embodiment is not limited thereto.

$$d61=d62=W44=W45 \qquad \text{[Equation 11]}$$

In accordance with Equation 11, in the second light emitting cell P2 exemplarily shown in FIG. 4E, second electrode holes are disposed in the center of the horizontal width WX and the center of the vertical width WY.

Figure 4F:
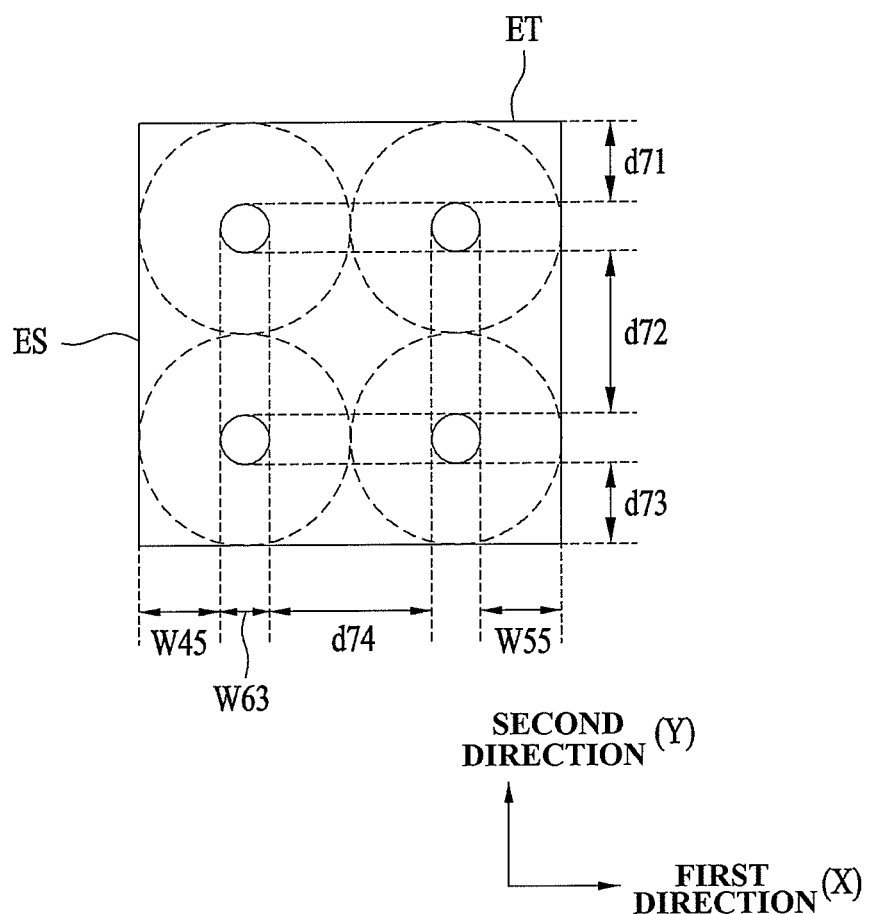

In addition, in the second light emitting cell P2 exemplarily shown in FIG. 4F, first distances d71 and d74 and second distances (fourth width W45, fifth widths W55, d71 and d73) may be represented by the following Equation 12, but the embodiment is not limited thereto.

$$d72=d74=2 \times d71$$

$$W63 > W62$$

$$d71=d73=W45=W55 \qquad \text{[Equation 12]}$$

Figure 4G:
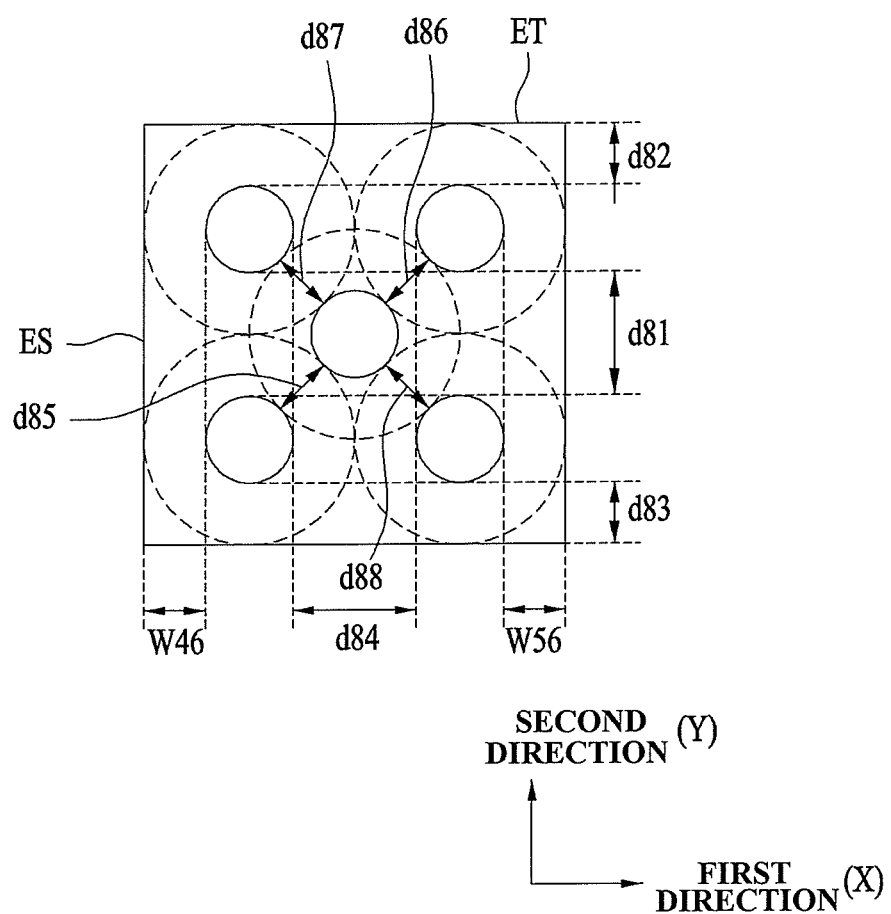

In addition, in the second light emitting cell P2 exemplarily shown in FIG. 4G, relation of first distances d85, d86, d87 and d88 and second distances (fourth width W46, fifth width W56, d82 and d83) may be represented by the following Equation 13, but the embodiment is not limited thereto.

$$d85=d86=d87=d88=W46=W56=d82=d83$$

$$d81=d84 \qquad \text{[Equation 13]}$$

The second light emitting cell P2 exemplarily shown in FIG. 4G has a planar shape further including a second electrode hole disposed in the center of the second light emitting cell P2 shown in FIG. 4F. As represented in Equation 13 above, first distances d85, d86, d87 and d88 which are the minimum distances between four second electrode holes disposed adjacent to four edges and the second electrode holes disposed in the center thereof are identical.

In addition, the minimum distances d81 and d84 between four second electrode holes, other than the second electrode hole disposed in the center may be identical. Here, the first distance d85 may be half of d81.

In the case of FIG. 4G, first distances d85, d86, d87 and d88 may be the same as second distances (fourth width W46, fifth width W56, d82 and d83).

Figure 4H:
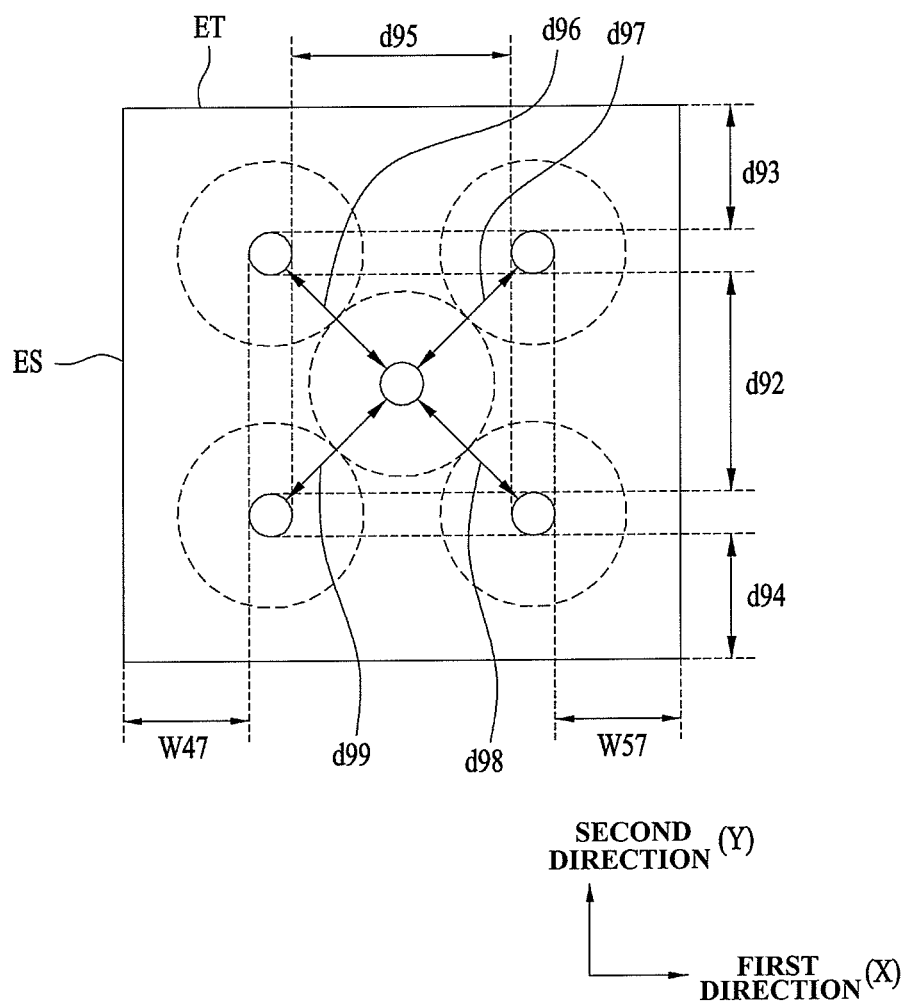

In addition, in the second light emitting cell P2 exemplarily shown in FIG. 4H, first distances d96, d97, d98 and d99 and second distances (fourth width W47, fifth width W57, d93 and d94) may be represented by the following Equation 14, but the embodiment is not limited thereto.

$$d96 = d97 = d98 = d99 \qquad \text{[Equation 14]}$$

$$d93 > \frac{1}{2} d92$$

$$d93 = d94 = W47 = W57$$

$$d92 = d95$$

$$W47 \ge \frac{1}{2} d96$$

In the case in which planar areas of the second light emitting cells P2 exemplarily shown in FIGS. 4E to 4H are identical, the sixth width W62 of the second electrode hole shown in FIG. 4E may be greater than the sixth width (for example, W63 shown in FIG. 4F) of the second electrode hole shown in FIGS. 4F to 4H.

Figure 5:
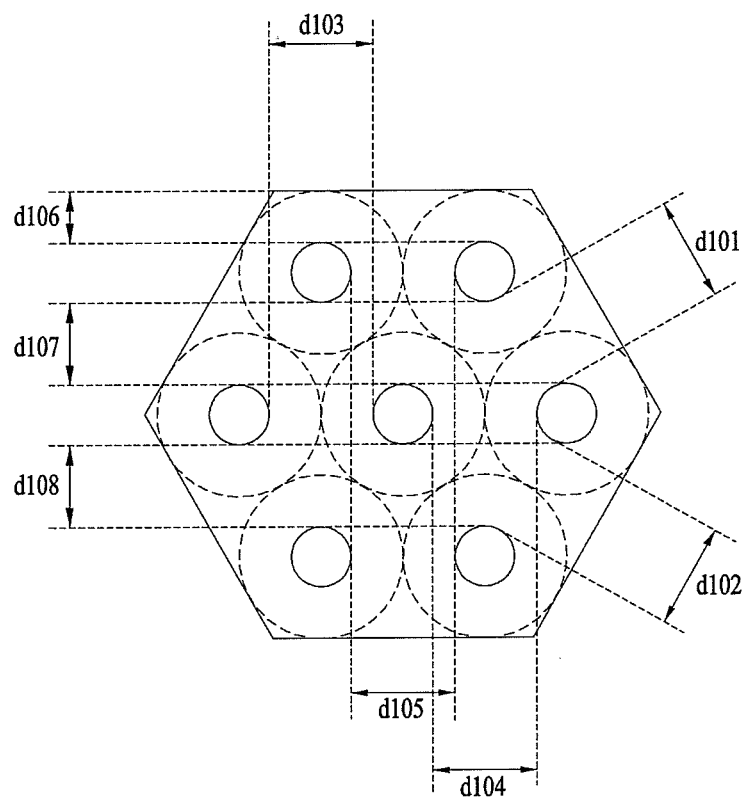
FIG. 5 is a plan view illustrating a second light emitting cell according to still another embodiment.
Figure 5:
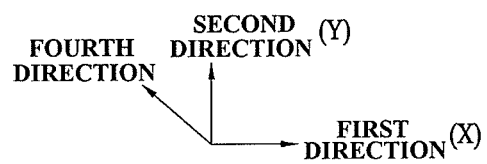
Figure 6:
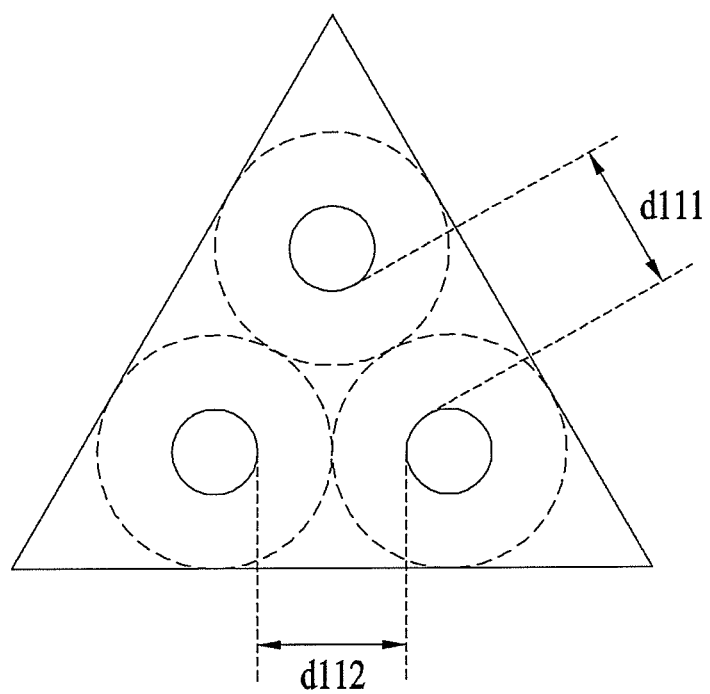
FIG. 6 is a plan view illustrating a second light emitting cell according to still another embodiment.
Figure 6:
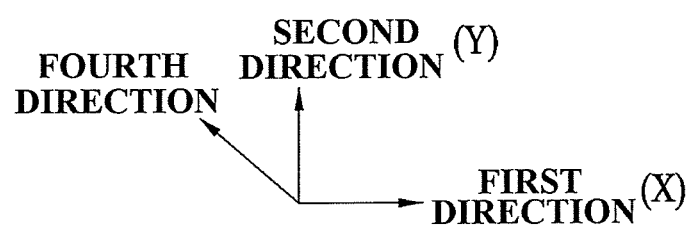

FIG. 5 is a plan view illustrating a second light emitting cell P2 according to still another embodiment and FIG. 6 is a plan view illustrating a second light emitting cell P2 according to still another embodiment. In FIGS. 5 and 6, the solide line represents the second electrode hole and the dotted line represents the current diffusion area.

As described above, the planar shape of the second light emitting cell P2 is a rectangle or square, but the embodiment is not limited thereto. According to still another embodiment, the planar shape of the second light emitting cell P2 may be a polygon or circle as well as rectangle.

That is, the planar shape of the second light emitting cell P2 may be a rectangle as exemplarily shown in FIGS. 1 and 3A, and FIGS. 4A to 4D, and the planar shape of the second light emitting cell P2 may be a square as exemplarily shown in FIGS. 4E to 4H.

In addition, as exemplarily shown in FIG. 5, the planar shape of the second light emitting cell P2 may be a regular hexagon. The first distances d101, d102, d103, d104, d105, d107 and d108 and the second distance d106 in the second light emitting cell P2 exemplarily shown in FIG. 5 may be represented by the following Equation 15, but the embodiment is not limited thereto.

$$d101=d102=d103=d104=d105=d107=d108$$

$$d106=2\times d106 \qquad \text{[Equation 15]}$$

As exemplarily shown in FIG. 6, the planar shape of the second light emitting cell P2 may be an equilateral triangle. In this case, first distances d111 and d112 which are the minimum distances between the second electrode holes respectively spaced in the first and fourth directions are identical.

As compare to when the planar shape of the second light emitting cell P2 is a rectangle as exemplarily shown in FIG. 3A and FIGS. 4A to 4D, current diffusion areas represented by the dotted line in respective drawings may be densely and uniformly formed, when the planar shape is a square exemplarily shown in FIGS. 4E to 4H, a cube exemplarily shown in FIG. 5, or an equilateral triangle exemplarily shown in FIG. 6. When the current diffusion areas are dense and uniform, an area utilization ratio of the second light emitting cell P2 increases so that improvement in light extraction efficiency in the limited area is maximized.

In addition, the first distance may be determined by the current density of the light emitting device 100. For example, as the desired current density of the light emitting device 100 decreases, the first distance may be determined to be increased and as the desired current density thereof increases, the first distance may be determined to be decreased.

In addition, the sixth width W6 of the mesa-etched second electrode hole H2 in the first direction X, the seventh width W7 which is the distance in the first direction X between the reflective layers 132 and 134, and the eighth width W8 in the first direction X of the first connection electrodes 150-1 disposed in the second electrode hole H2 may be determined in consideration of production process margin of the semiconductor device 100.

In addition, as described above, the second electrode hole exemplarily shown in FIGS. 1 and 3A, and FIGS. 4A to 4H has a circular planar shape, but the embodiment is not limited thereto. According to another embodiment, the second electrode hole may have various planar shapes.

Meanwhile, referring to FIG. 2 again, the first insulating layer may include first insulating segments 162-1 and 162-2, a second insulating segment 164, third insulating segments 166-1 and 166-2, and fourth insulating segments 168-1 and 168-2.

The first insulating segment includes a 1-1st insulating segment 162-1 and a 1-2nd insulating segment 162-2.

The 1-1st insulating segment 162-1 is disposed between adjacent first and second light emitting cells P1 and P2 connected by the first connection electrode 150-1 and the first connection electrode 150-1. For example, referring to FIG. 2, the 1-1st insulating segment 162-1 is disposed between each of the top and the side of the reflective layer 134 exposed, instead of being connected by the first connection electrode 150-1 in the first light emitting cell P1, and the first connection electrode 150-1, between each of the top and the side of the conductive layer 144 exposed when the third width W3 is smaller than the second width W2, and the first connection electrode 150-1, and between each of the top and side of the light emitting structure 120, and the first connection electrode 150-1. In addition, the 1-1st insulating segment 162-1 is also disposed between the substrate 110 and the first connection electrode 150-1.

In addition, the 1-1st insulating segment 162-1 is disposed between each of the top and the side of the reflective layer 132 in the second light emitting cell P2, and the first connection electrode 150-1, between each of the top and the side of the conductive layer 142 exposed when the third width W3 is less than the second width W2, and the first connection electrode 150-1, and between each of the top and side of the light emitting structure 120, and the first connection electrode 150-1.

Accordingly, the 1-1st insulating segment 162-1 may electrically insulate the first and second light emitting cells P1 and P2 adjacent to each other from the first connection electrode 150-1.

Similarly, the 1-2nd insulating segment 162-2 is disposed between adjacent second and third light emitting cells P2 and P3 connected by the second connection electrodes 150-2, and the second connection electrode 150-2. Accordingly, the 1-2nd insulating segment 162-2 may electrically insulate the adjacent second and third light emitting cells P2 and P3 from the second connection electrode 150-2.

In addition, the second insulating segment 164 is disposed between the adjacent first and second connection electrodes 150-1 and 150-2 in the second light emitting cell P2 where the first and second electrode units 172 and 174 are not disposed, among the light emitting cells P1, P2 and P3. That is, the second insulating segment 164 functions to electrically isolate the adjacent first and second connection electrodes 150-1 and 150-2 from each other.

In the light emitting cell P2, the first connection electrode 150-1 penetrates the 1-1st insulating segment 162-1 and the second insulating segment 164 embedded in the second electrode hole H2 and is electrically connected to the first conductive type semiconductor layer 122. Similarly, the 1-1st insulating segment 162-1 and the second insulating segment 164 are embedded in the second electrode hole H2 and function to electrically isolate the first connection electrode 150-1 from the mesa-etched light emitting structure 120.

In addition, the third insulating segment 166-2 includes a 3-1st insulating segment 166-1 and a 3-2nd insulating segment 166-2.

As described above, the 3-1st insulating segment 166-1 is an element formed upon the process as described later and may be omitted. The 3-2nd insulating segment 166-2 is disposed between the first electrode unit 172 and the first connection electrode 150-1 in the first light emitting cell P1 where the first electrode unit 172 is disposed, among the light emitting cells P1, P2 and P3.

In addition, as shown in FIG. 2, the light emitting device 100 may further include a metal electrode 180. The metal electrode 180 penetrates the third insulating segments 166-1 and 166-2, is disposed between the first electrode unit 172 and the first conductive type semiconductor layer 122, and electrically connects the first electrode unit 172 to the first conductive type semiconductor layer 122 via the first electrode hole H1. The shortest second horizontal distance sd2 between the metal electrode 180 and the first connection electrode 150-1 may be 5 μm or more. In addition, the material constituting the metal electrode 180 and the material constituting the first and second connection electrodes 150-1 and 150-2 may be identical or different.

When the light emitting device 100 includes the metal electrode 180, the 3-2nd insulating segment 166-2 is disposed in the first direction X between the metal electrode 180 and the first connection electrode 150-1 in the first light emitting cell P1 where the first electrode unit 172 is disposed, among the light emitting cells P1, P2 and P3, and electrically insulates the metal electrode 180 from the first connection electrode 150-1.

In addition, the 3-1st and 3-2nd insulating segments 166-1 and 166-2 are disposed between each of the light emitting structure 120, the reflective layers 132 and 134, and conductive layers 142 and 144, which are exposed during formation of the first electrode hole H1, and the metal electrode 180 (or, first electrode unit 172 when the metal electrode 180 is omitted). Accordingly, in the first light emitting cell P1, the 3-1st and 3-2nd insulating segments 166-1 and 166-2 may electrically insulate each of the light emitting structure 120, the reflective layers 132 and 134 and the conductive layers 142 and 144, from the metal electrode 180 (or, the first electrode unit 172 when the metal electrode 180 is omitted).

In addition, the fourth insulating segment includes a 4-1st insulating segment 168-1 and a 4-2nd insulating segment 168-2. The 4-1st insulating segment 168-1 is an element upon the process as described later and may be omitted.

The 4-2nd insulating segment 168-2 is disposed between the second electrode unit 174 and the second connection electrode 150-2 in the third light emitting cell P3, where the second electrode unit 174 is disposed, among the light emitting cells P1, P2 and P3, and electrically isolates the second electrode unit 174 from the second connection electrode 150-2.

In addition, the 4-2nd insulating segment 168-2 is disposed between each of the reflective layer 134, the conductive layer 144 and the light emitting structure 120 in the third light emitting cell P3, and the second connection electrode 150-2. Accordingly, each of the light emitting structure 120, the reflective layers 132 and 134 and the conductive layers 142 and 144 exposed during formation of the third electrode hole H3 in the third light emitting cell P3 may be electrically isolated from the second connection electrode 150-2 by the 1-2nd insulating segment 162-2 and the 4-2nd insulating segment 168-2.

The second connection electrode 150-2 penetrates the 1-2nd insulating segment 162-2 and the 4-2nd insulating segment 168-2 embedded in the third electrode hole H3 and is connected to the first conductive type semiconductor layer 122.

Meanwhile, the second insulating layer 190 is disposed on the first and second connection electrodes 150-1 and 150-2, on the second insulating segment 164, on the third insulating segments 166-1 and 166-2, and on the fourth insulating segments 168-1 and 168-2. Referring to FIG. 1, the second insulating layer 190 is not disposed inside regions 192 and 194.

The second insulating layer 190 may function as the 4-1st insulating segment 168-1 in the third light emitting cell P3. That is, the second insulating layer 190 may be provided instead of the 4-1st insulating segment 168-1.

When the third thickness t3 of the second insulating layer 190 increases, resistance to shock upon die bonding is improved. The third thickness t3 of the second insulating layer 190 is at least 1 nm to 80 nm and is for example 1 μm Each of the first insulating layers 162-1, 162-2, 164, 166-1, 166-2, 168-1 and 168-2 and the second insulating layer 190 may include an electrically insulating material and preferably has lower light transmittance and light absorbance. The reason for this is that a greater amount of light is emitted to the substrate 110 when the light emitting device 100 exemplarily shown in FIGS. 1 and 2 is implemented with a flip-chip type light emitting device package 200 exemplarily shown in FIG. 11.

The material constituting the first insulating layers 162-1, 162-2, 164, 166-1, 166-2, 168-1 and 168-2 and the material constituting the second insulating layer 190 may be identical or different.

Each of the first insulating layers 162-1, 162-2, 164, 166-1, 166-2, 168-1 and 168-2 and the second insulating layer 190 may be formed of at least one of $Al_2O_3$, $SiO_2$, $Si_3N_4$, $TiO_2$, or AlN or have a single or multiple layer structure.

In addition, when the light emitting device 100 exemplarily shown in FIGS. 1 and 2 is applied to the light emitting device package 200, as shown in FIG. 11, at least one of the first insulating layers 162-1, 162-2, 164, 166-1, 166-2, 168-1, 168-2, or the second insulating layer 190 may include a distributed Bragg reflector (DBR). In this case, the distributed Bragg reflector may perform at least one of an insulation or reflection function.

When the first insulating layers 162-1, 162-2, 164, 166-1, 166-2, 168-1 and 168-2 are implemented with a first distributed Bragg reflector, the first distributed Bragg reflector reflects light emitted from the light emitting cells P1, P2 and P3 and guides the light toward the substrate 110. Accordingly, the first distributed Bragg reflector prevents light emitted from the light emitting cells P1, P2 and P3 from being absorbed in the second insulating layer 190 and the first and second connection electrodes 150-1 and 150-2, thereby improving luminous efficacy.

In addition, when the second insulating layer 190 is implemented with a second distributed Bragg reflector, the second distributed Bragg reflector reflects light emitted from the light emitting cells P1, P2 and P3. Accordingly, the second distributed Bragg reflector prevents the light emitted from the light emitting cells P1, P2 and P3 from being absorbed in the first and second electrode units 172 and 174, thereby improving luminous efficacy.

Each of the first and second distributed Bragg reflectors may have a structure formed by alternately stacking a first layer and a second layer having different refraction indexes at least one time. Each of the first and second distributed Bragg reflectors may be an electrical insulator.

For example, the first layer may be a first dielectric layer such as $TiO_2$ and the second layer may be a second dielectric layer such as $SiO_2$. For example, the first distributed Bragg reflector may have a structure formed by stacking a $TiO_2$/$SiO_2$ layer at least one time. The first layer and the second layer each have a thickness of $\lambda/4$, wherein $\lambda$ represents a wavelength of light emitted from the light emitting cell.

When the second insulating layer 190 is implemented with DBR, the reflective layers 132 and 134 may be omitted, or only the first layer serving as the reflective layer 132 or 134 of the multiple layer structure may be omitted, or the first insulating layers 162-1, 162-2, 164, 166-1, 166-2, 168-1 and 168-2 may be not implemented with DBR.

Meanwhile, the first electrode unit 172 is connected to the first conductive type semiconductor layer 122 in one of the light emitting cells P1, P2 and P3, and the second electrode unit 174 is connected to the reflective layer (or, second conductive type semiconductor layer when the reflective layer and the conductive layer are omitted) in another of the light emitting cells P1, P2 and P3. That is, the second electrode unit 174 is electrically connected to the second conductive type semiconductor layer 126 via the reflective layer 134 and the conductive layer 144.

Referring to FIGS. 1 and 2, for example, the first electrode unit 172 may be disposed in the first light emitting cell P1 and be connected to the first conductive type semiconductor layer 122, and the second electrode unit 174 may disposed in the third light emitting cell P3 and be connected to the reflective layer 134 (or, second conductive type semiconductor layer 126 when the reflective layer 134 and the conductive layer 144 are omitted).

When the light emitting device 100 further includes the metal electrode 180, the first electrode unit 172 may penetrate the second insulating layer 190 and be connected to the first conductive type semiconductor layer 122 via the metal electrode 180.

However, when the metal electrode 180 exemplarily shown in FIG. 2 is omitted and the first electrode unit 172 is disposed in the position of the metal electrode 180, in the first light emitting cell P1, where the first electrode unit 172 is disposed, among the light emitting cells P1, P2 and P3, the first electrode unit 172 is electrically connected to the first conductive type semiconductor layer 122 such that it penetrates the second insulating layer 190 and the third insulating segments 166-1 and 166-2. That is, the first electrode unit 172 is connected to the first conductive type semiconductor layer 122 while penetrating the second insulating layer 190 and then penetrating the third insulating segments 166-1 and 166-2 embedded in the first electrode hole H1. In the first electrode hole H1, the first electrode unit 172 has an eighth width W8.

As such, when the light emitting device 100 does not include the metal electrode 180, the first electrode unit 172 should penetrate both the second insulating layer 190 and the third insulating segments 166-1 and 166-2, thus being capable of making it difficult to perform the manufacturing process due to increased aspect ratio. However, when the metal electrode 180 is disposed between the first electrode unit 172 and the first conductive type semiconductor layer 122, the manufacturing process may be easily performed due to decreased aspect ratio.

The second electrode unit 174 is electrically connected to the reflective layer 134 (or, the second conductive type semiconductor layer 126 when the reflective layer 134 and the conductive layer 144 are omitted) while penetrating the second insulating layer 190 and the fourth insulating segments 168-1 and 168-2.

Exterior power may be supplied to the light emitting device 100 through the first and second electrode units 172 and 174. The first and second electrode units 172 and 174 may include a pad to which a wire (not shown) for supplying the exterior power is bonded and serve as a pad.

In addition, each of the first and second electrode units 172 and 174 may perform a die bonding function without any die paste upon application of a material for eutetic bonding.

As exemplarily shown in FIGS. 1 and 2, the first electrode unit 172 is disposed in the first light emitting cell P1 in the light emitting device 100 and the second electrode unit 174 is disposed in the last light emitting cell PN (for example: P3) in the light emitting device 100, but the embodiment is not limited to the position of the first and second electrode units 172 and 174.

In addition, referring to FIG. 1, the first electrode unit 172 has a planar rectangular shape, while the second electrode unit 174 has a planar rectangular shape having a right side having a recess 174A. As such, when the first and second electrode units 172 and 174 have different planar shapes, the first and second electrode units 172 and 174 are easily distinguished from each other.

The first and second connection electrodes 150-1 and 150-2, the first and second electrode units 172 and 174 and the metal electrode 180 described above may include an electrically conductive metal material, for example, at least one material of platinum (Pt), germanium (Ge), copper (Cu), chromium (Cr), nickel (Ni), gold (Au), titanium (Ti), aluminum (Al), tantalum (Ta), tantalum nitride (TaN), titanium nitride (TiN), palladium (Pd), tungsten (W), or tungsten silicide (WSi2). In particular, the first and second connection electrodes 150-1 and 150-2 preferably have a greater thickness and include a material having superior conductivity and excellent adhesion to the first and second insulating layers 162-1, 162-2, 164, 166-1, 166-2, 168-1, 168-2 and 190.

Meanwhile, when the light emitting device 100 exemplarily shown in FIGS. 1 and 2 described above is implemented with a flip-chip type package exemplarily shown in FIG. 11 described later, a heat radiation unit 176 may be further disposed between first and second electrode units 172 and 174 on the second insulating layer 190. The heat radiation unit 176 may be formed of the same metal material as the first and second electrode units 172 and 174. As such, when the heat radiation unit 176 is disposed, heat generated in the light emitting cells P1, P2 and P3 in the light emitting device 100 may be further rapidly dispatched.

Figure 7:
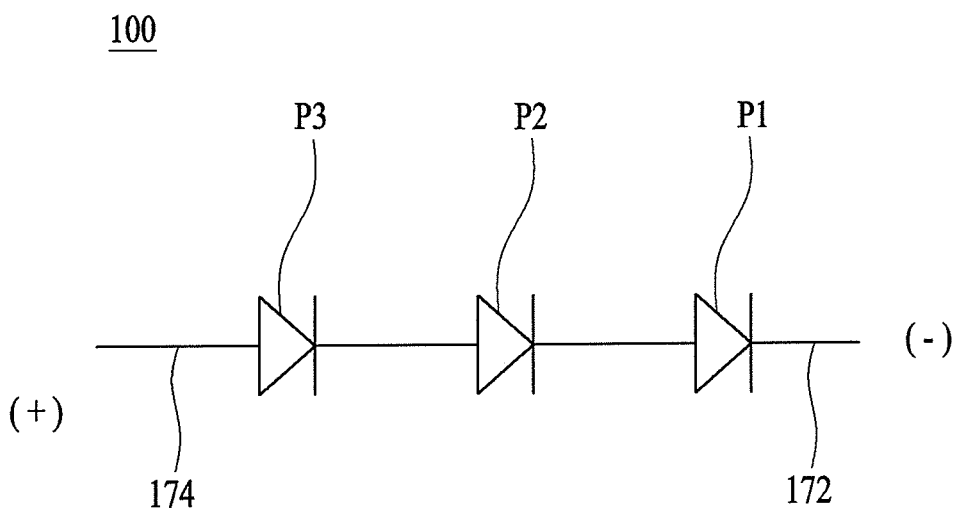
FIG. 7 is a circuit view of the light emitting device shown in FIGS. 1 and 2.

FIG. 7 is a circuit diagram illustrating the light emitting device 100 shown in FIGS. 1 and 2.

Referring to FIGS. 1, 2 and 7, the light emitting device 100 may have a negative (−) terminal 172 (or, first electrode unit or first pad) and a positive (+) terminal 174 (or, second electrode unit or second pad). When an external driving voltage is supplied through the first and second electrode units 172 and 174, the light emitting cells P1, P2 and P3 may be operated.

For better understanding of embodiments, the light emitting device 100 has been described as having three (N=3) light emitting cells P1, P2 and P3 and two connection electrodes 150-1 and 150-2. However, the description given above may be applied to the case in which the light emitting device 100 has less or more than three light emitting cells and less or more than two connection electrodes.

When the light emitting device 100 for example includes N (more than three) light emitting cells, two of the N light emitting cells may respectively correspond to first and third light emitting cells P1 and P3 shown in FIGS. 1, 2 and 7 and the remaining N−2 light emitting cells may respectively correspond to the second light emitting cell P2 shown in FIGS. 1, 2 and 7.

Hereinafter, plan views of embodiments of the light emitting device 100 including a plurality of (N>3) light emitting cells, each having various planar shapes will be described with reference to the annexed drawings.

Figure 8A:
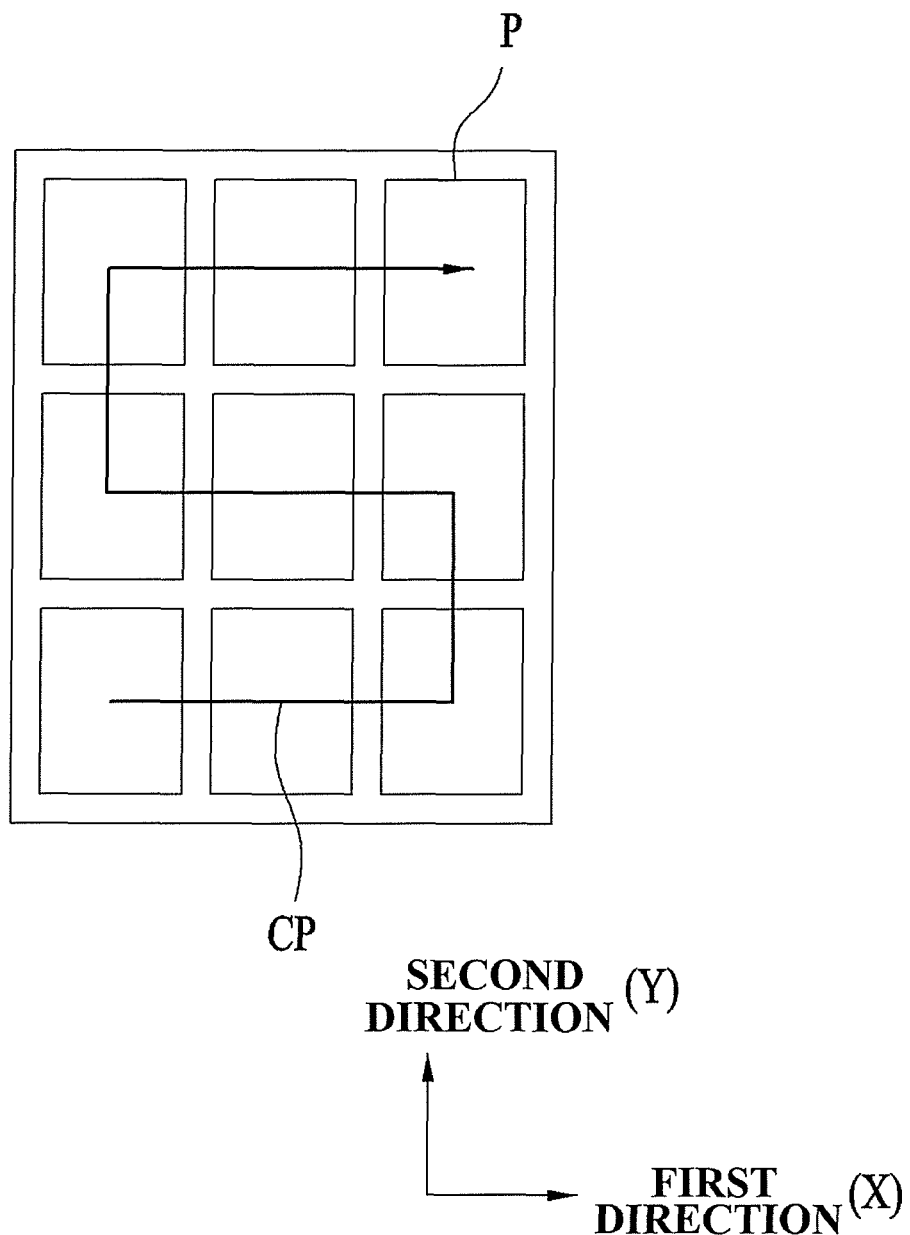
FIGS. 8A to 8C are plan views illustrating the light emitting device according to the embodiment.
Figure 8B:
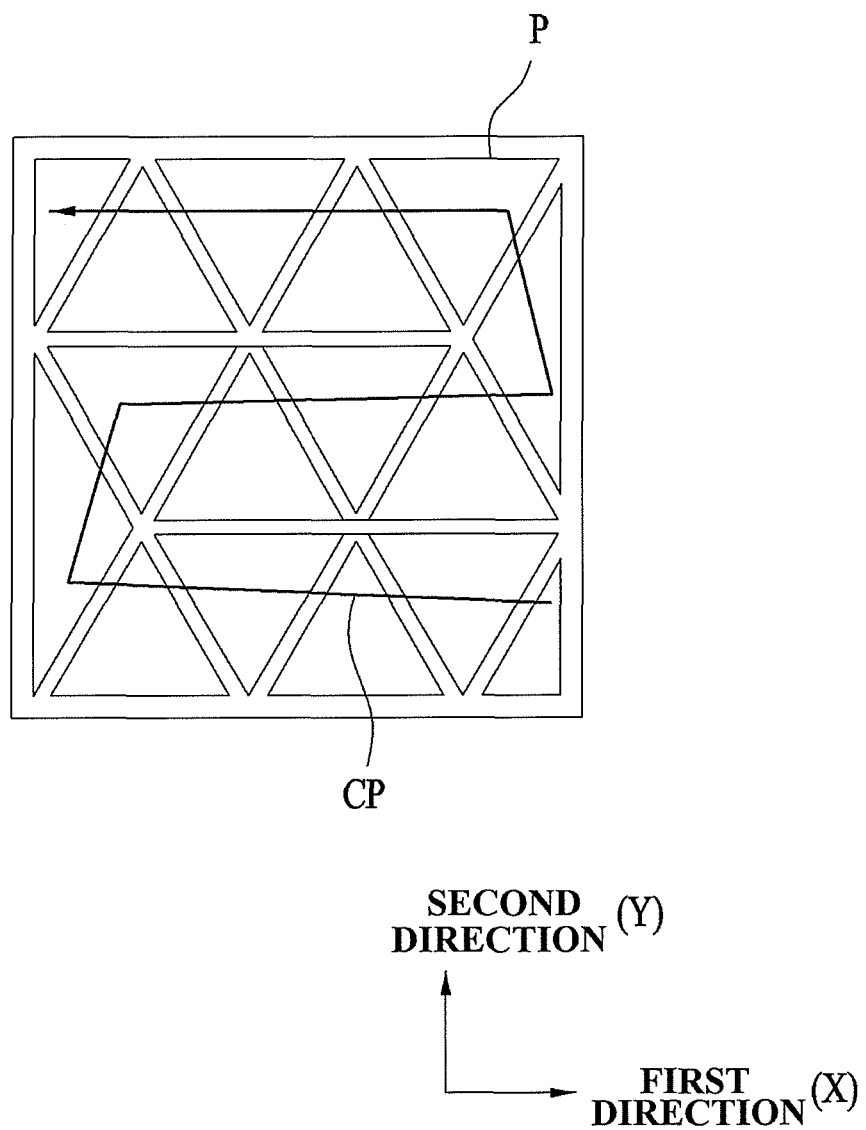
Figure 8C:
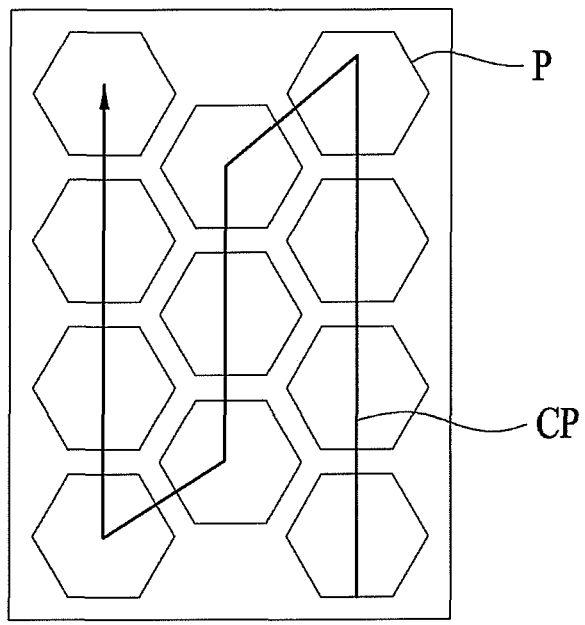
Figure 8C:
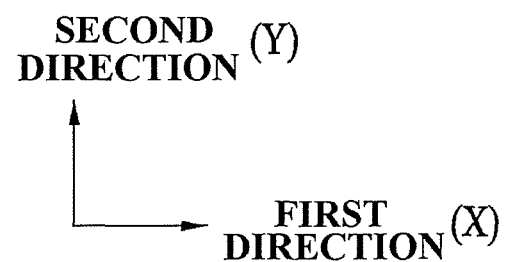

FIGS. 8A to 8C are plan views illustrating the light emitting device according to the embodiment.

Referring to FIG. 8A, the light emitting device includes nine (N=9) light emitting cells (P) having a rectangular planar shape. Each (P) of the light emitting cells may correspond to the light emitting cell exemplarily shown in FIGS. 1, 3A, and 4A to 4H.

Referring to FIG. 8B, the light emitting device has sixteen (N=16) light emitting cells (P) having a triangular planar shape. Each (P) of the light emitting cells may correspond to the light emitting cell having an equilateral triangle planar shape exemplarily shown in FIG. 6.

Referring to FIG. 8C, the light emitting device has eleven (N=11) light emitting cells P having a hexagonal planar shape. Each (P) of the light emitting cells may correspond to the light emitting cell having a regular hexagon planar shape exemplarily shown in FIG. 5.

In FIGS. 8A to 8C, connection of each light emitting cell P by M connection electrodes (not shown) so that current flows in an arrow direction CP has been described above with reference to FIGS. 1 and 2. That is, the M connection electrodes each have the same cross-sectional and planar shapes as first and second connection electrodes 150-1 and 150-2 shown in FIGS. 1 and 2.

Figure 9:
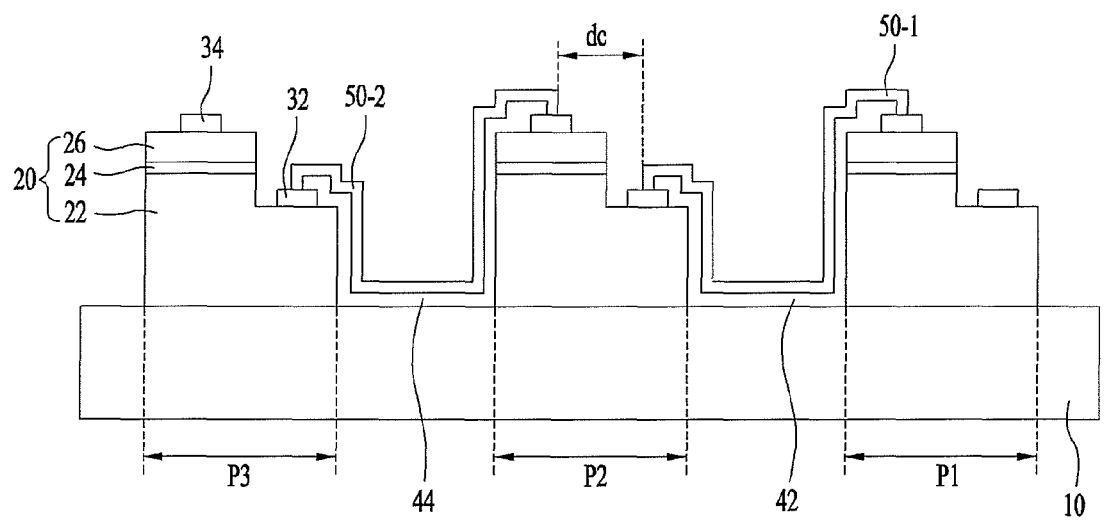
FIG. 9 is a local sectional view illustrating a light emitting device according to a comparative embodiment.

FIG. 9 is a local sectional view illustrating a light emitting device according to a comparative embodiment.

The light emitting device according to the comparative embodiment shown in FIG. 9 includes a substrate 10, three light emitting cells P1, P2 and P3, insulating layers 42 and 44 and connection electrodes 50-1 and 50-2.

Each of the light emitting cells P1, P2 and P3 has a light emitting structure 20 and first and second electrode units 32 and 34. The light emitting structure 20 includes a first conductive type semiconductor layer 22, an active layer 24 and a second conductive type semiconductor layer 26.

In FIG. 9, the second electrode unit 34 of the first light emitting cell P1 and the first electrode unit 32 of the second light emitting cell P2 are electrically connected to each other by the first connection electrode 50-1 and the second electrode unit 34 of the second light emitting cell P2 and the first electrode unit 32 of the third light emitting cell P3 are electrically connected to each other by the second connection electrode 50-2.

In this case, the insulating layer 42 is disposed between adjacent light emitting cells P1 and P2 and the first connection electrodes 50-1 and the insulating layer 44 is disposed between adjacent light emitting cells P2 and P3 and the second connection electrode 50-2. The insulating layer 42 functions to electrically insulate the light emitting cells P1 and P2 from the first connection electrodes 50-1 and the insulating layer 44 functions to electrically insulate adjacent light emitting cells P2 and P3 from the second connection electrode 50-2.

Electrons are supplied to the active layer 24 through the first electrode unit 32 via the first conductive type semiconductor layer 22 and holes are supplied to the active layer 24 through the second electrode unit 34 via the second conductive type semiconductor layer 26. However, a greater amount of electrons supplied through the first electrode unit 32 is apt to move in the shortest course from the first electrode unit 32 to the active layer 24 due to high resistance of the first conductive type semiconductor layer 22. Non-uniform spreading of such carriers deteriorates internal quantum efficiency, induces local heating in the light emitting cell and deteriorates reliability of the light emitting device.

However, in the case of the light emitting device 100 exemplarily shown in FIG. 2, first, second and third electrode holes H1, H2 and H3 are formed in the center of the horizontal width WX in the light emitting cells P1, P2 and P3, and the first and second connection electrodes 150-1 and 150-2 are connected to the first conductive type semiconductor layer 122 through the first, second and third electrode holes H1, H2 and H3. Thus, unlike the light emitting device exemplarily shown in FIG. 9 according to the comparative embodiment, in the case of the light emitting device 100 exemplarily shown in FIG. 2, electrons supplied through the first and second connection electrodes 150-1 and 150-2 may be uniformly spread to the active layer 124 disposed at left and right sides based on the first, second and third electrode holes H1, H2 and H3. Accordingly, as compared to the light emitting device according to the comparative embodiment exemplarily shown in FIG. 9, the light emitting device 100 according to the embodiment exemplarily shown in FIGS. 1 and 2 has improved internal quantum efficiency, prevents local heating of the light emitting device 100 and thereby maximizes reliability.

In addition, regarding the light emitting device according to the comparative embodiment shown in FIG. 9, the first and second connection electrodes 50-1 and 50-2 should be spaced from each other by a predetermined distance dc. If not, the first and second connection electrodes 50-1 and 50-2 may electrically be short-circuited, thus causing malfunction of the light emitting device.

However, regarding the light emitting device 100 according to the embodiment exemplarily shown in FIGS. 1 and 2, the first and second connection electrodes 150-1 and 150-2 connected to the first conductive type semiconductor layer 122 through the first, second and third electrode holes H1, H2 and H3 formed in the center of the light emitting cells P1, P2 and P3 are electrically insulated to each other through the second insulating segment 164. Accordingly, the first horizontal distance sd1 in the first direction X exemplarily shown in FIG. 2 may be much less than the horizontal distance dc according to the comparative embodiment exemplarily shown in FIG. 9. Thus, the area of the light emitting device 100 may efficiently be used and the total width in the first direction X which is the horizontal direction of the light emitting device 100 be thus reduced.

Hereinafter, the production method of the light emitting device 100 exemplarily shown in FIGS. 1 and 2 will be described with reference to the annexed FIGS. 10A to 10G, but the light emitting device 100 may be produced by other production method without limitation thereto.

FIGS. 10A to 10G are sectional views illustrating a method for manufacturing the light emitting device 100 exemplarily shown in FIGS. 1 and 2.

Figure 10A:
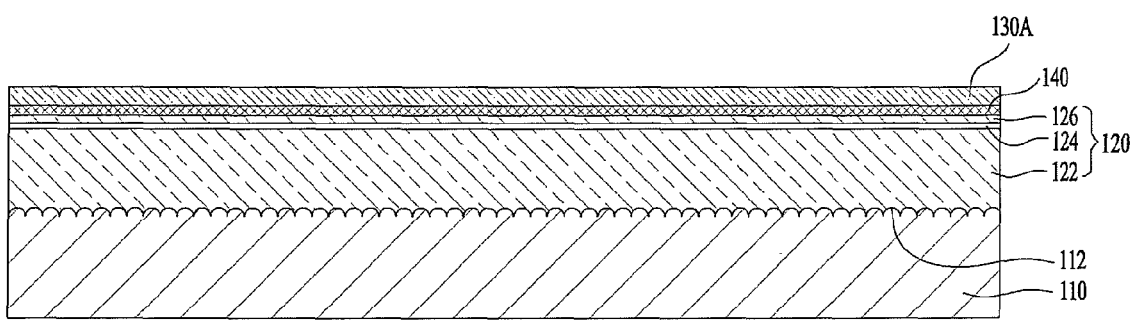
FIGS. 10A to 10G are sectional views illustrating a method for manufacturing the light emitting device shown in FIGS. 1 and 2.

Referring to FIG. 10A, an uneven pattern 112, that is, PSS, is formed on the substrate 100. Then, a light emitting structure 120, a conductive layer 140 and a reflective layer 130A are sequentially formed on the substrate (PSS) having the uneven pattern 112.

Figure 10B:
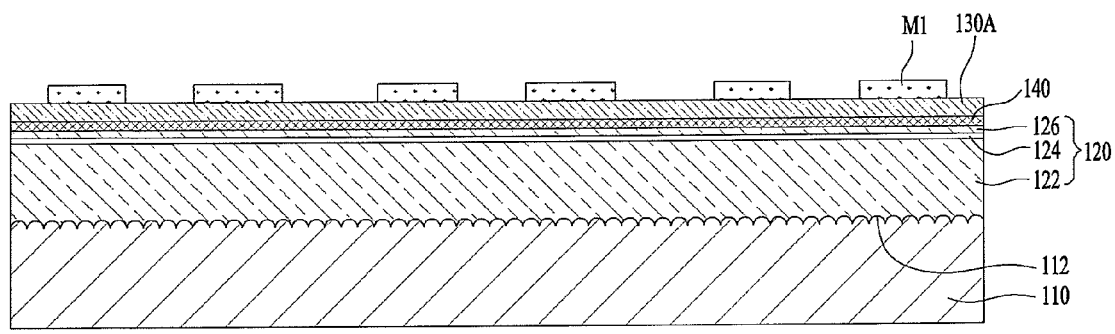

Then, referring to FIG. 10B, a first pattern mask M1 is formed on the reflective layer 130A. The first pattern mask M1 has an opening to open a boundary region S exemplarily shown in FIG. 2 and regions where the first, second and third electrode holes H1, H2 and H3 are formed.

Figure 10C:
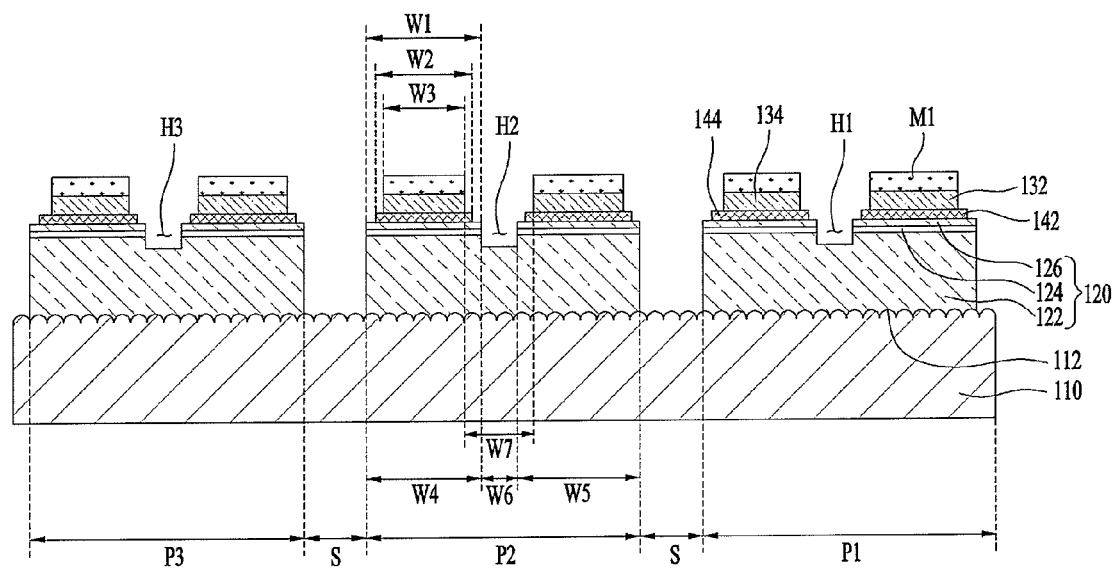

Next, referring to FIG. 10C, the reflective layer 130A, the conductive layer 140 and the light emitting structure 120 are sequentially mesa-etched using the first pattern mask M1 until the first conductive type semiconductor layer 122 is exposed to form first, second and third electrode holes H1, H2 and H3 and the first conductive type semiconductor layer 122 is etched until the substrate 110 of the boundary region S is exposed. In this case, the width of the opening of the first pattern mask M1 may be controlled so that the sixth width W6 of the first, second and third electrode holes H1, H2 and H3 satisfies a desired level. In addition, the reflective layer 130A, the conductive layer 140 and the second conductive type semiconductor layer 126 may be implemented using materials having different etching selectivity so that first to third widths W1, W2 and W3 satisfy values shown in Equation 1 to 5 above and the seventh width W7 is adjusted to a desired level. Then, the first pattern mask M1 is removed.

Alternatively, after first, second and third electrode holes H1, H2 and H3 are primarily formed using the first pattern mask M1 as described above, the first pattern mask M1 is removed, and the first conductive type semiconductor layer 122 may be etched using, as an etching mask, a separate pattern mask (not shown) covering the first, second and third electrode holes H1, H2 and H3 and having an opening exposing a region where the boundary region S is formed, until the substrate 110 of the boundary region S is exposed.

Figure 10D:
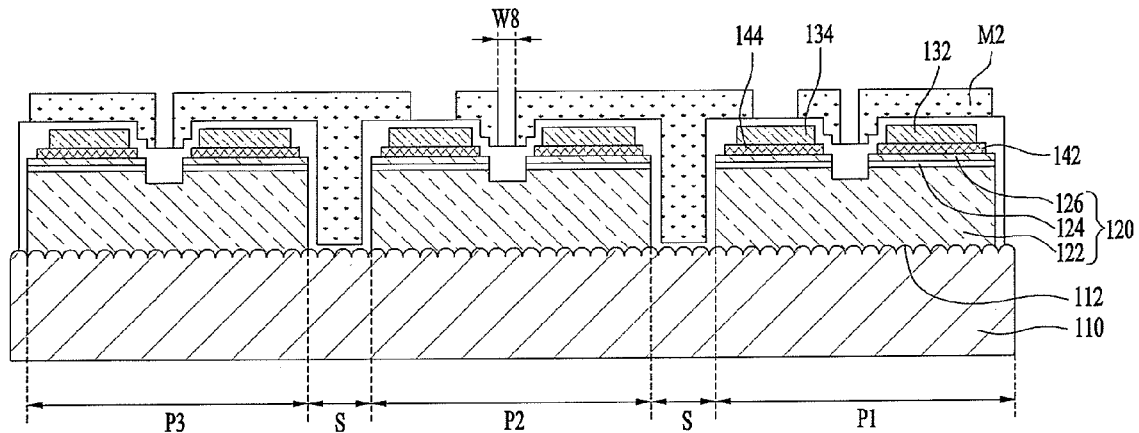

Next, referring to FIG. 10D, a first insulating layer 160 is formed on the resulting structure shown in FIG. 10C. Next, a second pattern mask M2 is formed on the first insulating layer 160. The second pattern mask M2 has an opening for exposing the corresponding parts of the reflective layer 132 and the first conductive type semiconductor layer 122 to which the first and second connection electrodes 150-1 and 150-2 and the metal electrode 180 are connected, as exemplarily shown in FIG. 2. An opening for etching the first insulating layer 160 embedded in the first, second and third electrode holes H1, H2 and H3 may have an eighth width W8.

Figure 10E:
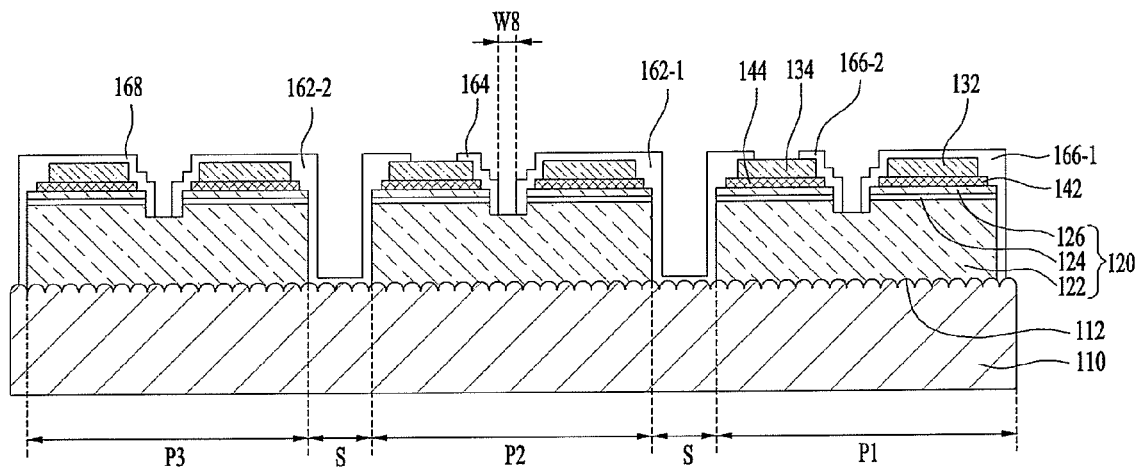

Next, referring to FIG. 10E, the first insulating layer 160 is etched using the second pattern mask M2 as an etching mask to form first insulating segments 162-1 and 162-2, a second insulating segment 164, third insulating segments 166-1 and 166-2 and a fourth insulating segment 168. Then, the second pattern mask M2 is removed. As such, the first insulating segments 162-1 and 162-2, the second insulating segment 164, the third insulating segments 166-1 and 166-2 and the fourth insulating segment 168 are obtained by etching one first insulating layer 160 and thus include the same insulating material.

Figure 10F:
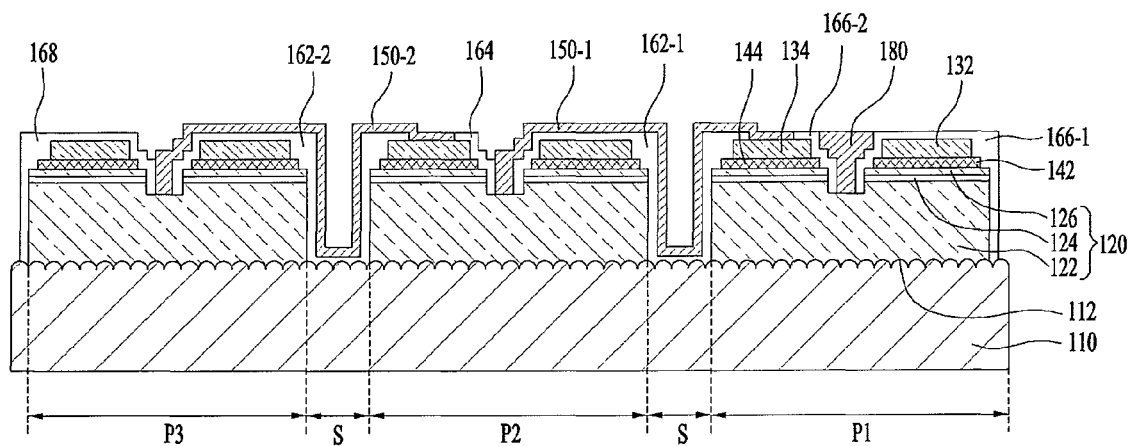

Next, referring to FIG. 10F, as shown in FIG. 10E, a metal layer (not shown) is formed with embedding a through hole through which the first conductive type semiconductor layer 122 is exposed by etching the first insulating layer 160 embedded in the first, second and third electrode holes H1, H2 and H3, on the first insulating layers 162-1, 162-2, 164, 166-1, 166-2 and 168) by deposition. Then, a third pattern mask (not shown) having an opening to expose the second insulating segment 164, the third insulating segments 166-1 and 166-2 and the fourth insulating segment 168 is formed on the metal layer. Then, the metal layer is etched using the third pattern mask as an etching mask to form the first and second connection electrodes 150-1 and 150-2 and the metal electrode 180. Then, the third pattern mask is removed.

Alternatively, before removal of the second pattern mask M2 after formation of the first to fourth insulating segments 162-1, 162-2, 164, 166-1, 166-2 and 168, as shown in FIG. 10E, the metal layer may be formed on the second pattern mask M2 by deposition with embedding the through hole to expose the first conductive type semiconductor layer 122 in the first, second and third electrode holes H1, H2 and H3. Then, the resulting structure shown in FIG. 10F may be formed when the second pattern mask M2 and the metal layer formed thereon are removed.

Figure 10G:
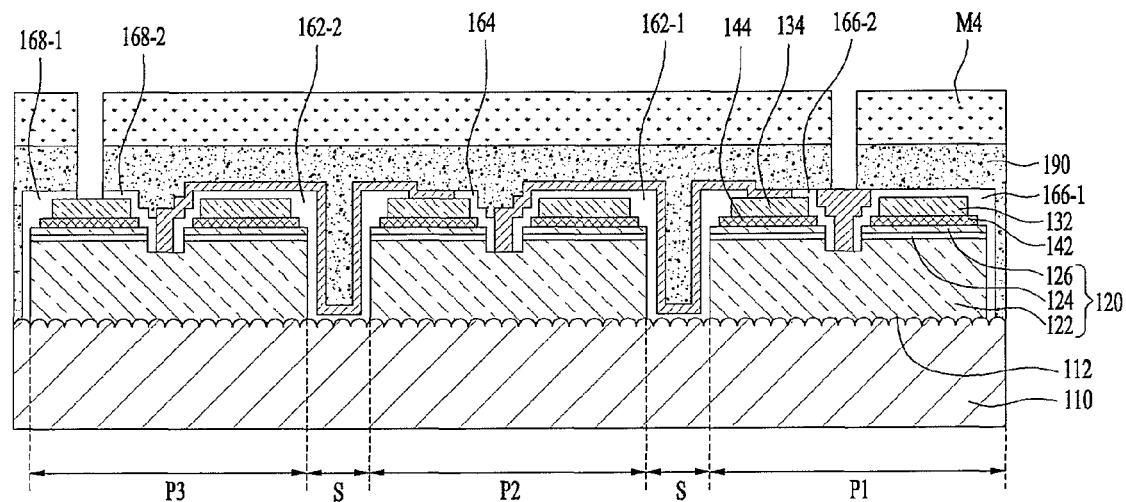

Then, as shown in FIG. 10G, a second insulating layer 190 is formed on the first and second connection electrodes 150-1 and 150-2, the second insulating segment 164, the third insulating segments 166-1 and 166-2 and the fourth insulating segment 168 and a fourth pattern mask M4 having an opening to expose the metal electrode 180 and the reflective layer 134, to which first and second electrode units 172 and 174 are connected, is formed on the second insulating layer 190. Then, the second insulating layer 190 is etched using the fourth pattern mask M4 as an etching mask to expose the corresponding reflective layer 134 and the metal electrode 180. Then, the fourth pattern mask M4 is removed.

Then, a metal material is embedded in the opening exposed by etching using the fourth pattern mask M4 to form first and second electrode units 172 and 174 as shown in FIG. 2.

Hereinafter, a light emitting device package 200 including the light emitting device 100 exemplarily shown in FIGS. 1 and 2 will be described with reference to FIG. 11. However, the light emitting device 100 exemplarily shown in FIGS. 1 and 2 may be used for the light emitting device package 200 in a form different from that shown in FIG. 11.

FIG. 11 illustrates a light emitting device package 200 including the light emitting device 100 according to an embodiment.

Referring to FIG. 11, the light emitting device package 200 includes a light emitting device 100, a first bump unit 212, a second bump unit 214, a first metal layer 222, a second metal layer 224 and a submount 230.

The light emitting device 100 is mounted to the submount 230. The submount 230 may be implemented with a package body, a printed circuit board or the like and may have various shapes so long as the light emitting device 100 is flip-chip bonded.

The light emitting device 100 is disposed on the submount 230 and is electrically connected through the first bump unit 212 and the second bump unit 214 to the first and second metal layers 222 and 224, respectively. The light emitting device 100 shown in FIG. 11 corresponds to the light emitting device 100 shown in FIGS. 1 and 2, but the embodiment is not limited thereto.

The submount 230 may include a resin such as polyphthalamide (PPA), a liquid crystal polymer (SCP) or polyamide9T (PA9T), a metal, a photo-sensitive glass, sapphire, a ceramic, a printed circuit board or the like. However, the material for the submount 230 according to the embodiment is not limited thereto.

The first metal layer 222 and the second metal layer 224 are spaced from each other in a first direction on the submount 230. Here, the upper surface of the submount 230 may be a surface that faces the light emitting device 100. The first metal layer 222 and the second metal layer 224 may be formed of a conductive metal such as aluminum (Al) or rhodium (Rh).

The first bump unit 212 is disposed between the first metal layer 222 and the light emitting device 100 and the second bump unit 214 is disposed between the second metal layer 224 and the light emitting device 100. The first bump unit 212 may electrically connect the first electrode unit 172 of the light emitting device 100 to the first metal layer 222. The second bump unit 214 may electrically connect the second electrode unit 174 of the light emitting device 100 to the second metal layer 224.

When the light emitting device package 200 is implemented as a flip-chip type exemplarily shown in FIG. 11, light is emitted upwardly in a negative (−) third direction Z through the substrate 110 instead of being emitted downwardly in a positive (+) third direction Z through the conductive layers 142 and 144 toward the submount 230. Accordingly, light extraction efficiency of the light emitting device package 200 is not affected by the first thickness t1 of the conductive layers 142 and 144 or by light absorbance or resistance properties of the conductive layers 142 and 144. Further, there may be no restriction caused by properties of the conductive layers 142 and 144 upon design of the first and second electrode units 172 and 174 and the mesa-region having a sixth width W6.

In addition, referring to FIG. 11, by virtue of the disposition of the reflective layers 132 and 134 under the conductive layers 142 and 144, spreading of carriers may be improved, electrical properties may be thus improved, and the conductive layers 142 and 144 may be formed to a small thickness. Therefore, the reflectivity is improved, thereby improving the optical properties of the light emitting device package 200.

In addition, it is assumed that the light emitting device package 200 is implemented as a flip-chip type exemplarily shown in FIG. 11, electrons are supplied through the first electrode unit 172 and holes are supplied through the second electrode unit 174. In this case, as described above, when the first, second and third widths W1, W2 and W3 are identical, the reflective layers 132 and 134 cover the entire region excluding a region having a seventh width W7, thus enabling uniform spreading of holes in the light emitting cells P1, P2 and P3, and improving electrical properties, such as, electrical conductivity. In particular, as described in the drawing, when the first, second and third electrode holes H1, H2 and H3 have a circular planar shape, carriers may be uniformly spread in a radial form.

In addition, regarding the light emitting device 100 and the light emitting device package 200, the number, distance and arrangement of electrode holes may be controlled according to desired current density.

In addition, when the number of electrode holes included in a unit light emitting cell increases, electrical properties of the light emitting device are improved, and when the number of electrode holes decreases, optical properties of the light emitting device are improved. Accordingly, in consideration of this point, the number of electrode holes may be determined.

An array of plural light emitting device packages in accordance with this embodiment may be mounted on a substrate, and optical members, such as a light guide panel, a prism sheet, a diffusion sheet, etc., may be disposed in a light passage of the light emitting device packages. The light emitting device packages, the substrate and the optical members may function as backlight units.

In accordance with other embodiments, the light emitting devices or the light emitting device package in accordance with the above-described embodiments may constitute a display apparatus, an indicating apparatus and a lighting device, and, for example, the lighting device may include a lamp or a streetlight.

Figure 12:
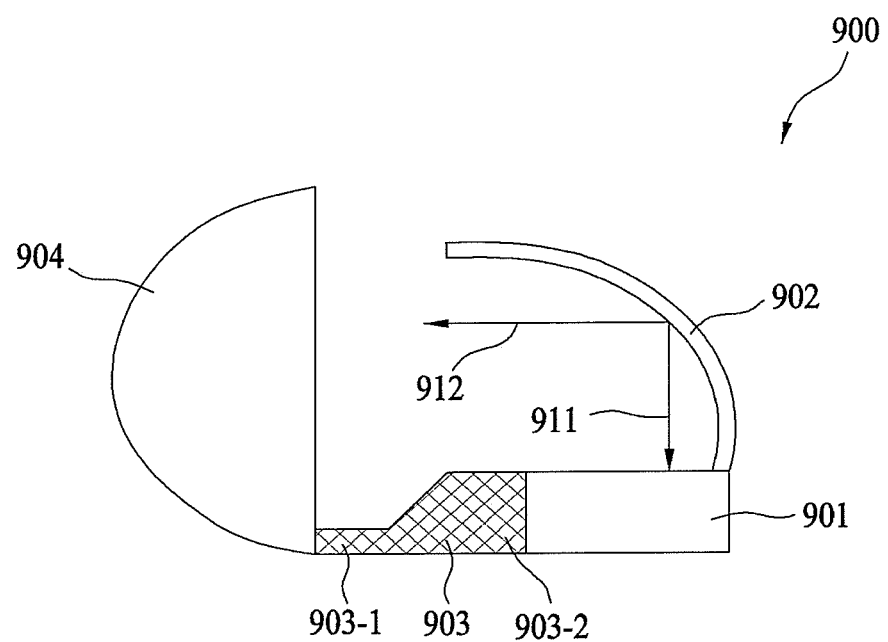
FIG. 12 illustrates a head lamp including the light emitting device package according to the embodiment.

FIG. 12 illustrates a head lamp 900 including the light emitting device package according to an embodiment.

Referring to FIG. 12, the head lamp 900 includes a light emitting module 901, a reflector 902, a shade 903 and a lens 904.

The light emitting module 901 may include light emitting device packages (not shown) disposed on the substrate (not shown). The light emitting device packages may be the same as light emitting device packages 200 according to the embodiment shown in FIG. 11.

The reflector 902 reflects light 911 emitted from the light emitting module 901 in a predetermined direction, for example, to the front direction 912.

The shade 903 is disposed between the reflector 902 and the lens 904 and is a member for forming a light distribution pattern satisfying the demand of a designer by blocking or reflecting a part of light which is reflected by the reflector 902 and travels toward the lens 904. The shade 903 may have one side 903-1 and the other side 903-2 which have different heights.

Light emitted from the light emitting module 901 is reflected by the reflector 902 and the shade 903 and then transmits the lens 904 and travels forward of the body. The lens 904 may refract light reflected by the reflector 902 forwardly.

Figure 13:
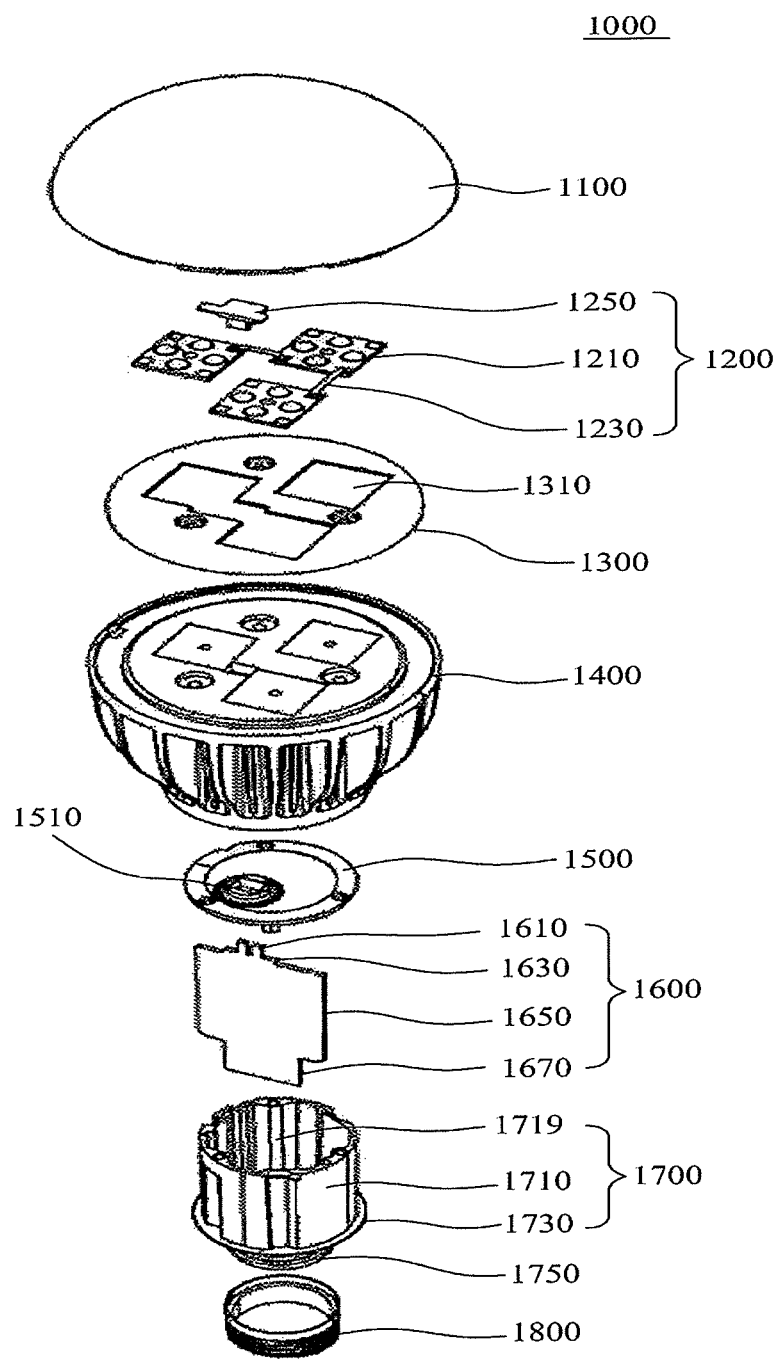
FIG. 13 illustrates a lighting device including the light emitting device or the light emitting device package according to the embodiment.

FIG. 13 illustrates a lighting device 1000 including the light emitting device or the light emitting device package according to the embodiment.

Referring to FIG. 13, the lighting device 1000 may include a cover 1100, a light source module 1200, a heat radiator 1400, a power supply 1600, an inner case 1700 and a socket 1800. In addition, the lighting device 1000 according to the embodiment may further include one or more of a member 1300 and a holder 1500.

The light source module 1200 may include the light emitting device 100 exemplarily shown in FIG. 2 or the light emitting device package 200 shown in FIG. 11.

The cover 1100 may have a bulb or hemispherical shape and may be a hollow having an opening part. The cover 1100 may be optically bonded to the light source module 1200. For example, the cover 1100 may diffuse, scatter or excite light supplied from the light source module 1200. The cover 1100 may be an optical member. The cover 1100 may be connected to the heat radiator 1400. The cover 1100 may have a connection portion for connection to the heat radiator 1400.

The inner surface of the cover 1100 may be coated with an ivory white coating material. The ivory white coating material may include a diffusion material for diffusing light. A surface roughness of the inner surface of the cover 1100 may be greater than that of the outer surface of the cover 1100. The reason for this is that light is sufficiently scattered and diffused from the light source module 1200 and is discharged to the outside.

The cover 1100 may be formed of a material such as glass, plastic, polypropylene (PP), polyethylene (PE), polycarbonate (PC) or the like. The polycarbonate has light resistance, heat resistance and strength. The cover 1100 may be transparent so that the light source module 1200 is visible from the outside, but the embodiment is not limited thereto and the cover 1100 may be non-transparent. The cover 1100 may be formed by blow molding.

The light source module 1200 may be disposed on a surface of the heat radiator 1400 and heat generated by the light source module 1200 may be transferred to the heat radiator 1400. The light source module 1200 may include a plurality of light source units 1210, a connection plate 1230 and a connector 1250.

The member 1300 may be disposed on the upper surface of the heat radiator 1400 and have a guide groove 1310 through which the light source units 1210 and the connector 1250 are inserted. The guide groove 1310 may be arranged to correspond to the substrate of the light source units 1210 and the connector 1250.

A light-reflecting material may be applied or coated on the surface of the member 1300.

For example, a white coating material may be applied or coated on the surface of the member 1300. The member 1300 may reflect light, which is reflected by an inner surface of the cover 1100 and returns to the light source module 1200, toward the cover 1100. Accordingly, luminous efficiency of the lighting device according to the embodiment is improved.

The member 1300 is for example formed of an insulating material. The connection plate 1230 of the light source module 1200 may include an electrically conductive material. Accordingly, the heat radiator 1400 may electrically contact the connection plate 1230. The member 1300 is composed of an insulating material, thus blocking electrical short-circuit between the connection plate 1230 and the heat radiator 1400. The heat radiator 1400 may receive heat from the light source module 1200 and heat from the power supply 1600 and dissipate the same.

The holder 1500 covers the accommodation groove 1719 of the insulation unit 1710 of the inner case 1700. Accordingly, the power supply 1600 accommodated in the insulation unit 1710 of the inner case 1700 may be sealed. The holder 1500 may have a guide protrusion 1510 and the guide protrusion 1510 may have a hole through which the protrusion 1610 of the power supply 1600 penetrates.

The power supply 1600 processes or converts an electrical signal supplied from the outside and supplies the same to the light source module 1200. The power supply 1600 may be accommodated in the accommodation groove 1719 of the inner case 1700 and may be sealed in the inner case 1700 by the holder 1500. The power supply 1600 may include a protrusion 1610, a guide portion 1630, a base 1650 and an extension portion 1670.

The guide portion 1630 may protrude outwardly from a side of the base 1650. The guide portion 1630 may be inserted into the holder 1500. A plurality of elements may be disposed on a surface of the base 1650. Examples of the elements include, but are not limited to, a direct current convertor that converts alternating current power supplied from an exterior power source into direct current power, a driving chip to control driving of the light source module 1200, an electrostatic discharge (ESD) protective element to protect the light source module 1200 from electric shock or the like.

The extension portion 1670 protrudes outwardly from another side of the base 1650. The extension portion 1670 may be inserted into the connection portion 1750 of the inner case 1700 and may receive an electrical signal from the outside. For example, a width of the extension portion 1670 may be smaller than or equal to that of the connection portion 1750 of the inner case 1700. One terminal of each of a positive (+) wire and a negative (−) wire is electrically connected to the extension portion 1670 and the other terminal thereof is electrically connected to the socket 1800.

The inner case 1700 may include a molding portion in addition to the power supply 1600. The molding portion is an area formed by hardening a molding liquid and fixes the power supply 1600 to an inner area of the inner case 1700.

The light emitting device according to embodiments and the light emitting device package including the same have a configuration in which the reflective layer is disposed under the conductive layer so that the thickness of the conductive layer is reduced, reflectivity is improved and optical properties are thus enhanced, and the package is implemented as a flip-chip form so that light extraction efficiency is not affected by the thickness and light absorbance or resistance properties of the conductive layer, and there is no limitation caused by characteristics of the conductive layer upon design of the first and second electrode units and mesa-regions.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a plurality of light emitting cells disposed on the substrate;
   at least one connection electrode for connecting the light emitting cells; and
   a first insulating layer disposed between adjacent light emitting cells connected by the connection electrode,
   wherein each of the light emitting cells includes:
   a light emitting structure including a first conductive type semiconductor layer, an active layer and a second conductive type semiconductor layer; and
   a reflective layer disposed on the second conductive type semiconductor layer,
   wherein the connection electrode connects the first conductive type semiconductor layer of a first one of the adjacent light emitting cells to the reflective layer of a second one at the adjacent light emitting cells, and
   wherein a first width, in a first direction, of the second conductive type semiconductor layer is the same as or greater than a second width, in the first direction, of the reflective layer, and the first direction is different from a thickness direction of the light emitting structure.

2. The light emitting device according to claim 1, wherein each of the light emitting cells further includes a conductive layer disposed between the reflective layer and the second conductive type semiconductor layer, and the conductive layer having a light-transmittance.

3. The light emitting device according to claim 2, wherein the first width of the second conductive type semiconductor layer is the same as the second width of the reflective layer, and a third width of the conductive layer in the first direction is the same as the first width of the second conductive type semiconductor layer.

4. The light emitting device according to claim 2, wherein at least one of the first width of the second conductive type semiconductor layer, the second width of the reflective layer, and a third width of the conductive layer in the first direction is different from another one of the first width of the second conductive type semiconductor layer, the second width of the reflective layer and the third width of the conductive layer.

5. The light emitting device according to claim 4, wherein the third width of the conductive layer is the same as or greater than the second width of the reflective layer.

6. The light emitting device according to claim 5, wherein the first width of the second conductive type semiconductor layer is the same as the third width of the conductive layer.

7. The light emitting device according to claim 5, wherein the first width of the second conductive type semiconductor layer is greater than the third width of the conductive layer.

8. The light emitting device according to claim 1, wherein the reflective layer ohmic-contacts the second conductive type semiconductor layer.

9. The light emitting device according to claim 1, wherein the reflective layer has a multiple layer structure.

10. The light emitting device according to claim 1, wherein the reflective layer has a reflectivity of 70% or more.

11. The light emitting device according to claim 1, wherein the reflective layer includes at least one of Ni, Pd, Ru, Mg, Zn, Hf, Ag, Al, Au, Pt, Cu, or Rh.

12. The light emitting device according to claim 1, wherein the reflective layer has a thickness of 0.5 nm to 4 μm.

13. The light emitting device according to claim 2, wherein the conductive layer has a thickness of 0.5 nm to 4 μm.

14. The light emitting device according to claim 1, further comprising:
   a first electrode unit connected to the first conductive type semiconductor layer of one of the light emitting cells; and
   a second electrode unit connected to the reflective layer of another one of the light emitting cells.

15. The light emitting device according to claim 14, further comprising a second insulating layer disposed on the connection electrode and on the first insulating layer,
   wherein the first electrode unit penetrates the first insulating layer and the second electrode unit penetrates the second insulating layer, and the first electrode unit is connected to the first conductive type semiconductor layer, and the second electrode unit is connected to the reflective layer.

16. The light emitting device according to claim 15, wherein the second insulating layer has a minimum thickness of 1 nm to 80 nm.

17. The light emitting device according to claim 15, wherein at least one of the first insulating layer or the second insulating layer includes a distributed Bragg reflector.

18. The light emitting device according to claim 1, wherein the connection electrode includes a reflective material.

19. The light emitting device according to claim 1, wherein a shortest distance in the first direction between the connection electrode and an adjacent connection electrode is 5 μm or greater.

20. A light emitting device package, comprising:
   a submount;
   first and second metal layers spaced from each other on the submount;
   the light emitting device according to claim 1; and
   first and second bump units for electrically connecting the light emitting device to the first and second metal layers, respectively.

21. A light emitting device, comprising:
   a substrate;
   a first light emitting cell on the substrate;
   a second light emitting cell on the substrate a connection electrode to connect the first light emitting cell to the second light emitting cell; and
   a first insulating layer between the first light emitting cell and the second light emitting cell connected by the connection electrode,
   wherein the first light emitting cell includes:
   a first conductive type semiconductor layer, an active layer and a second conductive type semiconductor layer, and
   a first reflective layer on the second conductive type semiconductor layer,
   wherein the second light emitting cell includes:
   a second reflective layer,
   wherein the connection electrode connects the first conductive type semiconductor layer of the first light emitting cell to the second reflective layer of the second light emitting cell, and
   wherein a first width of the second conductive type semiconductor layer is the same as or greater than a second width of the first reflective layer.

22. The light emitting device according to claim 21, wherein the first light emitting cell includes a conductive layer between the first reflective layer and the second conductive type semiconductor layer, and the conductive layer having a light-transmittance.

23. The light emitting device according to claim 22, wherein the first width of the second conductive type semiconductor layer is the same as the second width of the reflective layer, and a third width of the conductive layer is the same as the first width of the second conductive type semiconductor layer.

24. The light emitting device according to claim 22, wherein one of the first width of the second conductive type semiconductor layer, the second width of the reflective layer, and a third width of the conductive layer is different from another one of the first width of the second conductive type semiconductor layer, the second width of the reflective layer and the third width of the conductive layer.

25. The light emitting device according to claim 21, wherein the first reflective layer has a multiple layer structure.

26. The light emitting device according to claim 21, wherein the first reflective layer has a reflectivity of 70% or more.

27. The light emitting device according to claim 21, wherein the first reflective layer has a thickness of 0.5 nm to 4 μm.

* * * * *